(12) United States Patent
Cho et al.

(10) Patent No.: US 11,726,618 B2
(45) Date of Patent: Aug. 15, 2023

(54) DISPLAY DEVICE

(71) Applicant: Samsung Display Co., Ltd., Yongin-si (KR)

(72) Inventors: Hyun Min Cho, Yongin-si (KR); Dae Hyun Kim, Yongin-si (KR); Sung Chul Kim, Yongin-si (KR); Hye Yong Chu, Yongin-si (KR); Keun Kyu Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/473,614

(22) Filed: Sep. 13, 2021

(65) Prior Publication Data

US 2021/0405807 A1    Dec. 30, 2021

Related U.S. Application Data

(63) Continuation of application No. 17/013,516, filed on Sep. 4, 2020, now Pat. No. 11,120,739, which is a
(Continued)

(30) Foreign Application Priority Data

Feb. 13, 2018   (KR) ........................ 10-2018-0017681

(51) Int. Cl.
*H01L 33/44* (2010.01)
*G06F 3/042* (2006.01)
(Continued)

(52) U.S. Cl.
CPC ............ *G06F 3/0421* (2013.01); *G06F 3/042* (2013.01); *G06F 3/0412* (2013.01);
(Continued)

(58) Field of Classification Search
CPC ....... H01L 33/00; H01L 33/007; H01L 33/20; H01L 33/32; H01L 33/38; H01L 33/08;
(Continued)

(56) References Cited

U.S. PATENT DOCUMENTS 8,872,214 B2   10/2014  Negishi et al.
9,112,112 B2   8/2015   Do et al.
(Continued)

FOREIGN PATENT DOCUMENTS

JP    2010-539474 A    12/2010
JP    5292077 B2       6/2013
(Continued)

OTHER PUBLICATIONS

Product Catalog: MACOM™ GaAs PIN Diode Chips, https://www.macom.com/support (7 sheets).
(Continued)

*Primary Examiner* — Chuong A Luu
(74) *Attorney, Agent, or Firm* — Lewis Roca Rothgerber Christie LLP

(57) ABSTRACT

A display device including a substrate and a plurality of pixels in a display region of the substrate. Each of the pixels includes first and second sub-pixels, and each of the first and second sub-pixels has a light emitting region for emitting light. The first sub-pixel includes a first light emitting element in the light emitting region and configured to emit visible light. The second sub-pixel includes a second light emitting element in the light emitting region and configured to emit infrared light and a light receiving element configured to receive the infrared light emitted from the second light emitting element to detect a user's touch. The second light emitting element and the light receiving element in the second sub-pixel are electrically insulated from and optically coupled to each other to form a photo-coupler.

15 Claims, 14 Drawing Sheets

Related U.S. Application Data continuation of application No. 16/169,749, filed on Oct. 24, 2018, now Pat. No. 10,769,990.

(51) Int. Cl.
   *G09G 3/3225* (2016.01)
   *H01L 33/20* (2010.01)
   *H01L 33/38* (2010.01)
   *H01L 33/32* (2010.01)
   *G06F 3/041* (2006.01)
   *H01L 33/00* (2010.01)

(52) U.S. Cl.
   CPC ......... *G09G 3/3225* (2013.01); *H01L 33/007* (2013.01); *H01L 33/20* (2013.01); *H01L 33/32* (2013.01); *H01L 33/38* (2013.01); *G09G 2380/02* (2013.01)

(58) Field of Classification Search
   CPC ......... H01L 33/06; H01L 33/36; H01L 33/62; H01L 33/18; H01L 33/44; H01L 33/0095; H01L 33/0079; H01L 33/52; H01L 25/167; H01L 27/15; H01L 27/156; H01L 27/1214; H01L 51/50; H01L 51/52; H01L 51/5271; H01L 51/5206; H01L 51/5253; H01L 51/5284; H01L 51/5278; H01L 51/5064; H01L 25/16; H01L 31/101; H01L 33/58; G06F 3/041; G06F 3/042; G06F 3/0412; G06F 3/0421; G09G 3/3225; G09G 2380/02; G09G 2300/0426

USPC .......................................................... 257/82
   See application file for complete search history.

(56) References Cited

U.S. PATENT DOCUMENTS

| | | |
   |---|---|---|
   | 9,570,002 B2 | 2/2017 | Sakariya et al. |
   | 9,773,761 B2 | 9/2017 | Do |
   | 10,769,990 B2 | 9/2020 | Cho et al. |
   | 11,120,739 B2 * | 9/2021 | Cho ..................... G06F 3/042 |
   | 2011/0089850 A1 | 4/2011 | Shibata et al. |
   | 2011/0122071 A1 | 5/2011 | Powell |
   | 2011/0148816 A1 | 6/2011 | Jhu et al. |

FOREIGN PATENT DOCUMENTS

| | | |
   |---|---|---|
   | KR | 10-2007-0004741 A | 1/2007 |
   | KR | 10-0986491 B1 | 10/2010 |
   | KR | 10-1244926 B1 | 3/2013 |
   | KR | 10-2013-0135764 A | 12/2013 |
   | KR | 10-1490758 B1 | 2/2015 |
   | KR | 10-2017-0037344 A | 9/2022 |

OTHER PUBLICATIONS

Korean Notice of Allowance issued in corresponding application No. KR 10-2018-0017681, dated Nov. 21, 2022, 7 pages (References cited herein were previously submitted in the IDS filed on Dec. 14, 2022).

* cited by examiner

DISPLAY DEVICE

CROSS-REFERENCE TO RELATED APPLICATIONS

This application is a continuation of U.S. patent application Ser. No. 17/013,516, filed Sep. 4, 2020, which is a continuation of U.S. patent application Ser. No. 16/169,749, filed Oct. 24, 2018, now U.S. Pat. No. 10,769,990, which claims priority to and the benefit of Korean Patent Application No. 10-2018-0017681, filed Feb. 13, 2018, the entire content of all of which is incorporated herein by reference.

BACKGROUND

1. Field

Aspects of exemplary embodiments of the present invention relate to a display device.

2. Discussion

Light emitting diodes (hereinafter referred to as LEDs) exhibit relatively good durability even under adverse environmental conditions and have excellent performance in terms of lifetime and luminance.

In recent years, research for applying LEDs to various display devices has been actively conducted.

As a part of this research, a technique for manufacturing ultra-small rod-like LEDs on a micro- or nano-scale using an inorganic crystal structure, for example, a structure where a nitride-based semiconductor is grown, is being developed. For example, the rod-like LEDs may be manufactured small enough to constitute a pixel or the like of a self-emission display device.

SUMMARY

One or more embodiments of the present invention provide a display device including rod-like LEDs and having an improved touch recognition rate.

According to an embodiment of the present invention, a display device includes a substrate and a plurality of pixels in a display region of the substrate. Each of the pixels includes first and second sub-pixels, and each of the first and second sub-pixels has a light emitting region for emitting light. The first sub-pixel includes a first light emitting element in the light emitting region and configured to emit visible light. The second sub-pixel includes a second light emitting element in the light emitting region and configured to emit infrared light and a light receiving element configured to receive the infrared light emitted from the second light emitting element to detect a user's touch. The second light emitting element and the light receiving element in the second sub-pixel are electrically insulated from and optically coupled to each other to form a photo-coupler.

The second light emitting element may include a rod-like light emitting diode configured to emit the infrared light, and the light receiving element may include a photo diode configured to receive the infrared light.

The first light emitting element may emit light of one of red, green, blue, and white colors light.

Each of the first and second sub-pixels may include a transistor on the substrate.

The transistor may include: a semiconductor layer on the substrate; a gate electrode on the semiconductor layer with a gate insulation layer therebetween; and source and drain electrodes connected to the semiconductor layer.

The light receiving element may be configured to detect the infrared light emitted from the second light emitting element that is reflected from a user's finger and may convert the detected light into an electric signal.

The second sub-pixel may further include a read-out line for receiving the electric signal of the light receiving element.

Each of the first light emitting element, the second light emitting element, and the light receiving element may include: a first conductive semiconductor layer doped with a first conductive dopant; a second conductive semiconductor layer doped with a second conductive dopant; and an active layer between the first conductive semiconductor layer and the second conductive semiconductor layer.

Each of the first light emitting element and the second light emitting element may include a light emitting diode having a cylindrical column or a polygonal column shape on a microscale or nanoscale size.

The display device may further include: an insulation layer on the substrate, the second light emitting element, and the light receiving element; and an overcoat layer on the insulation layer.

The display device may further include a light blocking pattern on the insulation layer in the second sub-pixel. The light blocking pattern may have a first opening exposing a portion of the insulation layer corresponding to the second light emitting element and a second opening exposing a portion of the insulation layer corresponding to the light receiving element.

The light blocking pattern may block the infrared light emitted from the second light emitting element from being incident on the first sub-pixel that is adjacent to the second sub-pixel.

The display device may further include a light extracting layer on the overcoat layer, and the light extracting layer may be configured to focus light incident on the light receiving element.

The light extracting layer may include a lens portion corresponding to the light receiving element.

The display device may further include a light blocking pattern on the overcoat layer in the second sub-pixel. The light blocking pattern may have a first opening exposing a portion of the overcoat layer corresponding to the second light emitting element and a second opening exposing a portion of the overcoat layer corresponding to the light receiving element.

The light blocking pattern may not be in the first sub-pixel.

Each of the second light emitting element and the light receiving element may have a first end and a second end in a longitudinal direction. The second end of the second light emitting element and the first end of the light receiving element may face each other on the substrate.

The display device may further include: a (1-1)th electrode on the substrate and adjacent to the first end of the second light emitting element; a second electrode on the same plane as the (1-1)th electrode and between the second end of the second light emitting element and the first end of the light receiving element; a (1-2)th electrode on the same plane as the second electrode and adjacent to the second end of the light receiving element; a (1-1)th contact electrode electrically connected to the (1-1)th electrode and the first end of the second light emitting element; a (1-2)th contact electrode electrically connected to the (1-2)th electrode and the second end of the light receiving element; and a second contact electrode electrically connected to the second end of the second light emitting element and the first end of the light receiving element.

The second contact electrode may be in a layer different from the (1-1)th contact electrode and the (1-2)th contact electrode.

The light blocking pattern may overlap the (1-1)th contact electrode, the (1-2)th contact electrode, and the second contact electrode when viewed in a plan view.

The display device may further include: a (1-1)th electrode on the substrate and adjacent to the first end of the second light emitting element; a (2-1)th electrode on the same plane as the (1-1)th electrode and adjacent to the second end of the second light emitting element; a (2-2)th electrode on the same plane as the (2-1)th electrode and adjacent to the first end of the light receiving element; a (1-2)th electrode on the same plane as the (2-2)th electrode and adjacent to the second end of the light receiving element; a (1-1)th contact electrode electrically connected to the (1-1)th electrode and the first end of the second light emitting element; a (1-2)th contact electrode electrically connected to the (1-2)th electrode and the second end of the light receiving element; a (2-1)th contact electrode electrically connected to the second end of the second light emitting element and the (2-1)th electrode; and a (2-2)th contact electrode electrically connected to the first end of the light receiving element and the (2-2)th electrode.

The (2-1)th contact electrode and the (2-2)th contact electrode may be spaced apart from each other on the substrate and are on the same layer.

According to another embodiment of the present invention, a display device includes: a substrate having a display region and a non-display region; a plurality of pixels in the display region of the substrate. Each of the pixels includes first to fourth sub-pixels, and each of the first to fourth sub-pixels has a light emitting region for emitting light. Each of the first to third sub-pixels includes a first light emitting element in the corresponding light emitting region and configured to emit visible light, and the fourth sub-pixel includes a second light emitting element in the light emitting region and configured to emit infrared light and a light receiving element configured to receive the infrared light emitted from the second light emitting element to detect a user's touch. The display device further includes: an insulation layer on the first light emitting element, the second light emitting element, and the light receiving element; and a light blocking pattern on the insulation layer in the fourth sub-pixel and having a first opening exposing a portion of the insulation layer corresponding to the second light emitting element and a second opening exposing a portion of the insulation layer corresponding to the light receiving element. The second light emitting element and the light receiving element are electrically insulated from and optically coupled to each other to form a photo-coupler.

The second light emitting element may include a rod-like light emitting diode configured to emit the infrared light, and the light receiving element may include a photo diode configured to receive the infrared light.

The light blocking pattern may block the infrared light emitted from the second light emitting element from being incident on the first to third sub-pixels adjacent to the fourth sub-pixel.

The light blocking pattern may not be provided in the first to third sub-pixels.

BRIEF DESCRIPTION OF THE DRAWINGS

The accompanying drawings, which are included to provide a further understanding of the present invention and are incorporated in and constitute a part of this specification, illustrate exemplary embodiments of the present invention and, together with the description, describe aspects and features of the present invention.

DETAILED DESCRIPTION

Figure 1:
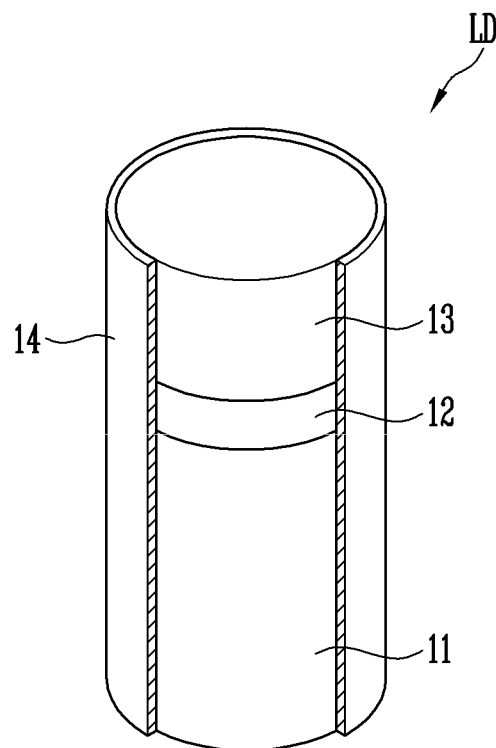
FIG. 1 is a perspective view illustrating a rod-like light emitting diode according to an embodiment of the present invention.

Reference will now be made in detail to various example (or exemplary) embodiments of the present invention that are illustrated in the accompanying drawings and are described below. Embodiments of the present invention may be variously modified in many different forms. Thus, these exemplary embodiments are not intended to limit the present invention to particular modes of practice, and it is to be appreciated that all changes, equivalents, and substitutes that do not depart from the spirit and technical scope of the present invention are encompassed by the present invention.

Like reference numerals refer to like elements throughout the various figures and embodiments of the present invention. The sizes of elements in the accompanying drawings may be exaggerated for clarity of illustration. It will be understood that, although the terms "first," "second," etc. may be used herein to describe various elements, these elements should not be limited by these terms. These terms are used to distinguish one element from another element. For instance, a first element discussed below could be termed a second element without departing from the present invention. Similarly, the second element could also be termed the first element. In the present disclosure, singular forms are intended to include plural forms as well, unless the context clearly indicates otherwise.

It will be further understood that the terms "comprise," "include," "have," etc. when used in this specification, specify the presence of stated features, integers, steps, operations, elements, components, and/or combinations thereof but do not preclude the presence or addition of one or more other features, integers, steps, operations, elements, components, and/or combinations thereof. Furthermore, when a first part, such as a layer, a film, a region, or a plate, is disposed on a second part, the first part may not only be directly on the second part but a third part may intervene between them. When it is expressed that a first part, such as a layer, a film, a region, or a plate, is formed on a second part, the surface of the second part on which the first part is formed is not limited to an upper surface of the second part but may include other surfaces, such as a side surface or a lower surface of the second part. When a first part, such as a layer, a film, a region, or a plate, is under a second part, the first part may not only be directly under the second part but a third part may intervene between them.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Hereinafter, exemplary embodiments of the present invention will be described in detail with reference to the accompanying drawings.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

FIG. 1 is a perspective view illustrating a rod-like light emitting diode according to an embodiment of the present invention. In FIG. 1, a rod-like light emitting diode LD having a cylindrical column shape is shown, but the present invention is not limited thereto.

Referring to FIG. 1, the rod-like light emitting diode LD according to an embodiment of the present invention may include a first conductive semiconductor layer 11, a second conductive semiconductor layer 13, and an active layer 12 disposed between the first conductive semiconductor layer 11 and the second conductive semiconductor layer 13. For example, the rod-like light emitting diode LD may be formed as a laminate in which the first conductive semiconductor layer 11, the active layer 12, and the second conductive semiconductor layer 13 are sequentially stacked. In the following embodiments, the rod-like light emitting diode LD is referred to as "a rod-like LED LD".

According to an embodiment of the present invention, the rod-like LED LD may have a rod shape extending along one direction. When an extension direction of the rod-like LED LD is a longitudinal direction, the rod-like LED LD may have one end and another end along the extension direction. According to an embodiment of the present invention, one of the first conductive semiconductor layer 11 and the second conductive semiconductor layer 13 may be disposed at the one end of the rod-like LED LD, and the other one of the first conductive semiconductor layer 11 and the second conductive semiconductor layer 13 may be disposed at the other end thereof.

In an embodiment of the present invention, the rod-like LED LD may have a cylindrical column shape, but the present invention is not limited thereto. The term "rod-like" may include a rod or bar shape extending along the longitudinal direction and having an aspect ratio greater than 1, such as a cylindrical column, a polygonal column, or the like. For example, the length of the rod-like LED LD may be greater than the diameter thereof.

For example, the rod-like LED LD may be manufactured having a small size, for example, having a diameter and/or length on the order of a micro- or nano-scale. The size of the rod-like LED LD according to an embodiment of the present invention is not limited thereto and may be changed according to a display device to which the rod-like LED LD is applied.

The first conductive semiconductor layer 11 may include an n-type semiconductor layer. For example, the first conductive semiconductor layer 11 may include one of the semiconductor materials including indium aluminum gallium nitride (InAlGaN), gallium nitride (GaN), aluminum gallium nitride (AlGaN), indium gallium nitride (InGaN), aluminum nitride (AlN), indium nitride (InN), and the like and may be doped with a first conductive dopant, such as silicon (Si), germanium (Ge), tin (Sn), and the like. However, the first conductive semiconductor layer 11 is not limited thereto, and the first conductive semiconductor layer 11 may include various other suitable materials.

The active layer 12 may be disposed on the first conductive semiconductor layer 11 and may have a single or multiple quantum well structure. The active layer 12 may include AlGaN, InAlGaN, or the like.

According to an embodiment of the present invention, a cladding layer doped with a conductive dopant may be disposed on an upper portion and/or a lower portion of the active layer 12. The cladding layer may include AlGaN, InAlGaN, or the like.

When an electric field exceeding a threshold voltage is applied across (e.g., applied to both ends of) the rod-like LED LD, electron-hole pairs are generated in the active layer 12 such that the rod-like LED LD emits light.

The second conductive semiconductor layer 13 may be disposed on the active layer 12 and may include a semiconductor layer of a different type than the first conductive semiconductor layer 11. For example, the second conductive semiconductor layer 13 may include a p-type semiconductor layer. The second conductive semiconductor layer 13 may include at least one of the semiconductor materials including InAlGaN, GaN, AlGaN, InGaN, AlN, and InN and may be doped with a second conductive dopant, such as magnesium (Mg) and the like. The second conductive semiconductor layer 13 is not limited thereto, and the second conductive semiconductor layer 13 may include various other suitable materials.

According to an embodiment of the present invention, the rod-like LED LD may include at least one of a phosphor layer, an active layer, a semiconductor layer, and/or an electrode layer disposed on an upper and/or lower portion of each of the first conductive semiconductor layer 11, the active layer 12, and the second conductive semiconductor layer 13.

In addition, the rod-like LED LD may further include an insulation layer 14. The insulation layer 14 may be provided on a portion of the first conductive semiconductor layer 11, the active layer 12, and the second conductive semiconductor layer 13. For example, the insulation layer 14 may be provided at a portion except for both ends of the rod-like LED LD so that both ends of the rod-like LED LD are exposed.

In FIG. 1, a portion of the insulation layer 14 is illustrated as being removed, but this is merely for illustration. In some embodiments, all side surfaces (e.g., the entire side surface) of the rod-like LED LD may be covered (or surrounded) by the insulation layer 14.

The insulation layer 14 may be provided to cover (or surround) at least a portion of the outer surface of the first conductive semiconductor layer 11, the active layer 12, and/or the second conductive semiconductor layer 13. For example, the insulation layer 14 may be provided to surround at least the outer surface of the active layer 12.

The insulation layer 14 may include a transparent insulating material. For example, the insulation layer 14 may include at least one insulating material selected from the group consisting of silicon oxide (e.g., $SiO_2$), silicon nitride (e.g., $Si_3N_4$), aluminum oxide (e.g., $Al_2O_3$), and titanium oxide (e.g., $TiO_2$). However, the present invention is not limited thereto, and various other suitable insulating materials may be used.

When the insulation layer 14 is provided on the rod-like LED LD, the active layer 12 may not be short-circuited to first and/or second electrodes, to be described further below. In addition, surface defects in the rod-like LED LD may be reduced or minimized by the insulation layer 14 so that lifetime and efficiency aspects of the rod-like LED LD may be improved. When a plurality of rod-like LEDs LD are disposed adjacent to each other, the insulation layer 14 may prevent unwanted shorts from occurring between the rod-like LEDs LD.

The rod-like LED LD may be used as a light emitting source for various display devices. For example, the rod-like LED LD may be used as a light emitting source of a lighting device or a self-emission display device.

Figure 2A:
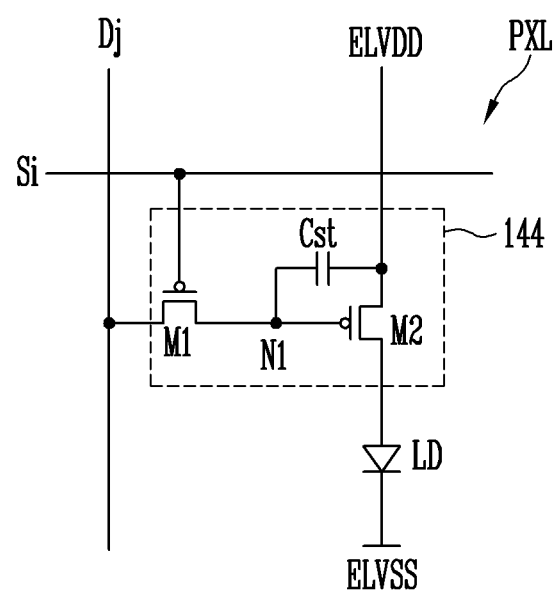
FIGS. 2A and 2B are circuit diagrams illustrating a unit light emitting region of a light emitting device according to an embodiment of the present invention.
Figure 2B:
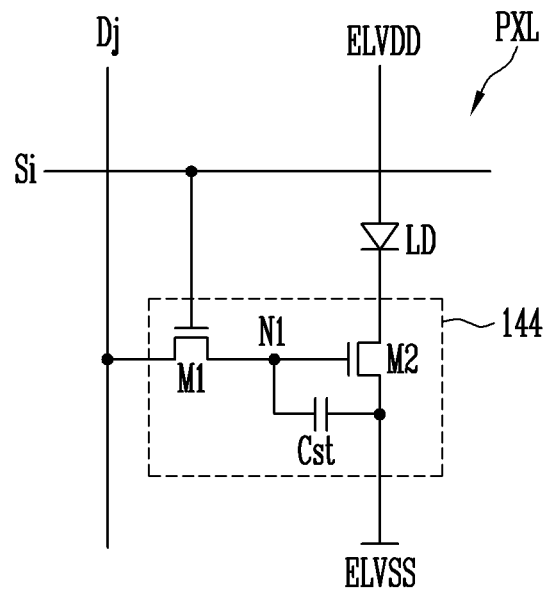

FIGS. 2A and 2B are circuit diagrams illustrating a unit light emitting region of a light emitting device according to an embodiment of the present invention.

In particular, FIGS. 2A and 2B illustrate examples of a pixel of an active matrix (e.g., active type) light emitting display panel. In an embodiment of the present invention, the unit light emitting region may include one pixel.

Referring to FIG. 2A, a pixel PXL may include a rod-like LED LD and a pixel circuit 144 connected thereto.

A first electrode (e.g., an anode electrode) of the rod-like LED LD may be connected to a first power source ELVDD via the pixel circuit 144, and a second electrode (e.g., a cathode electrode) of the rod-like LED LD may be connected to a second power source ELVSS.

The first power source ELVDD and the second power source ELVSS may have different voltage levels. For example, the second power source ELVSS may have a voltage level lower than a voltage level of the first power ELVDD by at least a threshold voltage of the rod-like LED LD.

The rod-like LED LD may emit light having a luminance corresponding to the driving current controlled by the pixel circuit 144.

Although FIG. 2A shows an embodiment in which the pixel PXL includes only one rod-like LED LD, the present invention is not limited thereto. For example, the pixel PXL may include a plurality of the rod-like LEDs LD connected in parallel with each other.

According to an embodiment of the present invention, the pixel circuit 144 may include first and second transistor M1 and M2 and a storage capacitor Cst. However, the structure of the pixel circuit 144 is not limited to the embodiment shown in FIG. 2A.

A first electrode of the first transistor M1 (e.g., a switching transistor) may be connected to a data line Dj, and a second electrode of the first transistor M1 may be connected to a first node N1. The first electrode and the second electrode of the first transistor M1 may be different electrodes. For example, the first electrode may be a source electrode, and the second electrode may be a drain electrode. In addition, a gate electrode of the first transistor M1 may be connected to a scan line Si.

The first transistor M1 may be turned on when a scan signal having a voltage (e.g., a low voltage) capable of turning on the first transistor M1 is supplied from the scan line Si and may electrically connect the data line Dj and the first node N1. A data signal of the corresponding frame is supplied to the data line Dj so that the data signal is transmitted to the first node N1. The data signal transferred to the first node N1 is charged in the storage capacitor Cst.

A first electrode of the second transistor M2 (e.g., a driving transistor) may be connected to the first power source ELVDD, and a second electrode of the second transistor M2 may be connected to the first electrode of the rod-like LED LD. A gate electrode of the second transistor M2 may be connected to the first node N1. The second transistor M2 may control the amount of the driving current supplied to the rod-like LED LD corresponding to the voltage of the first node N1.

One electrode of the storage capacitor Cst may be connected to the first power source ELVDD, and another electrode of the storage capacitor Cst may be connected to the first node N1. The storage capacitor Cst may charge a voltage corresponding to the data signal supplied to the first node N1 and may maintain the charged voltage until the data signal of the next frame is supplied.

For convenience, FIG. 2A shows the pixel circuit 144 as having a relatively simple structure including the first transistor M1 for transferring the data signal to the pixel PXL, the storage capacitor Cst for storing the data signal, and the second transistor M2 for supplying a driving current corresponding to the data signal to the rod-like LED LD. However, the present invention is not limited thereto, and the structure of the pixel circuit 144 may be variously suitably modified. For example, the pixel circuit 144 may further include a transistor element, such as a transistor element for compensating a threshold voltage of the second transistor M2, a transistor element for initializing the first node N1, a transistor element for controlling the light emission time of the rod-like LED LD, and/or other circuit elements, such as a boosting capacitor for boosting the voltage at the first node N1.

As illustrated in FIG. 2A, the transistors included in the pixel circuit 144, for example, the first and second transistors M1 and M2, are all P-type transistors, but the present invention is not limited thereto. In other embodiments, at least one of the first and second transistors M1 and M2 included in the pixel circuit 144 may be replaced with an N-type transistor.

Referring to FIG. 2B, according to an embodiment of the present invention, the first and second transistors M1 and M2 may be implemented as N-type transistors. The pixel circuit 144 shown in FIG. 2B is similar in configuration and operation to the pixel circuit 144 shown in FIG. 2A except that the connection of some components is changed due to a change in the transistor type. Therefore, a repeated detailed description thereof will be omitted.

Figure 3:
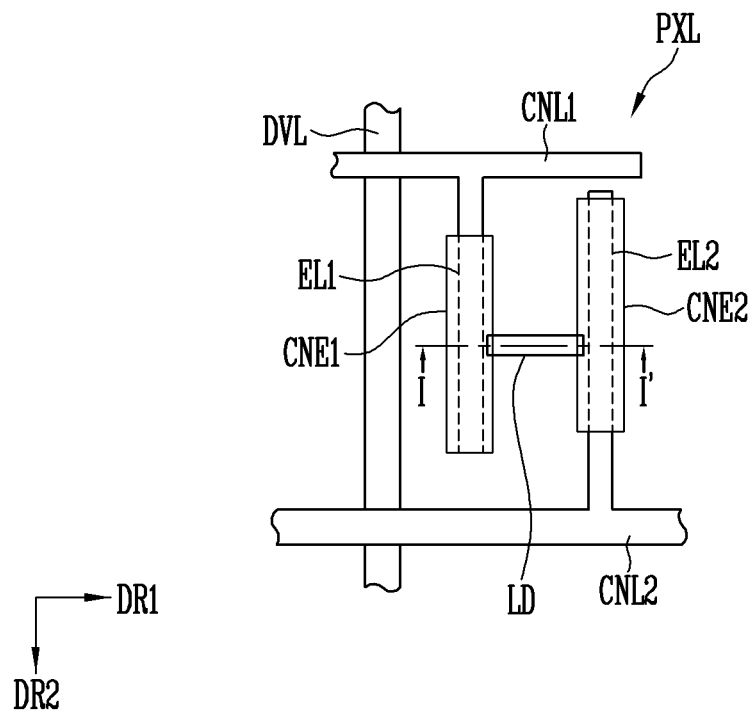
FIG. 3 is a plan view illustrating the unit light emitting region of the light emitting device including the rod-like light emitting diode shown in FIG. 1.
Figure 4:
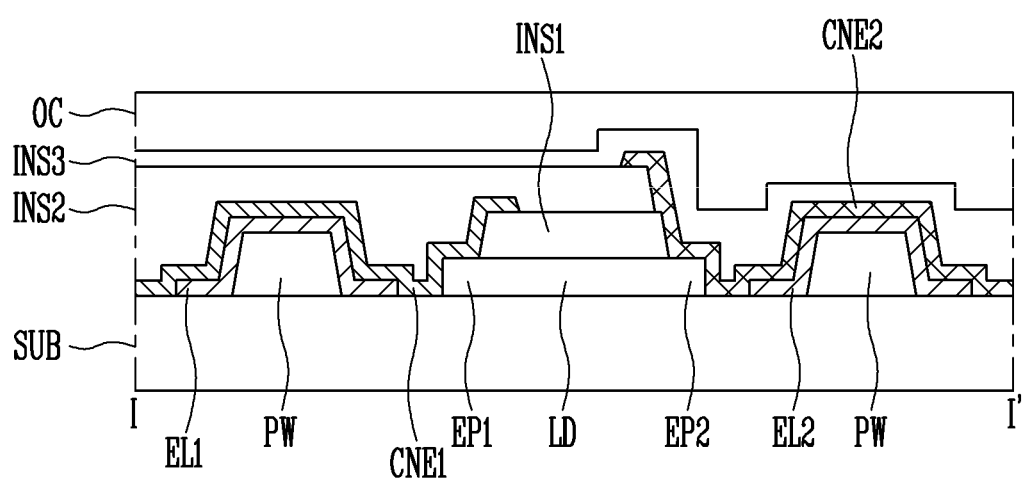
FIG. 4 is a cross-sectional view taken along the line I-I' of FIG. 3.

FIG. 3 is a plan view illustrating the unit light emitting region of the light emitting device including the rod-like LED LD shown in FIG. 1, and FIG. 4 is a cross-sectional view taken along the line I-I' of FIG. 3.

In FIG. 3, although the rod-like LED LD is shown as being aligned in a horizontal direction for convenience of illustration, the arrangement of the rod-like LED LD is not limited thereto. For example, the rod-like LED LD may be aligned in an oblique direction between the first and second electrodes.

In FIG. 3, the unit light emitting region may be a pixel region including one pixel of the light emitting display panel. In addition, although FIG. 3 shows an embodiment in which one rod-like LED LD is provided in the unit light emitting region, the present invention is not limited thereto. For example, a plurality of the rod-like LEDs LD may be provided in the unit light emitting region.

Referring to FIGS. 1-4, the light emitting device according to an embodiment of the present invention may include a substrate SUB, a partition wall PW, first and second electrodes EL1 and EL2, the rod-like LED LD, and first and second contact electrodes CNE1 and CNE2.

The substrate SUB may include an insulating material, such as glass, organic polymer, quartz, or the like. In addition, the substrate SUB may be made of a flexible material to be bendable or foldable and may have a single-layer structure or a multi-layer structure.

For example, the substrate SUB may include at least one material selected from the group consisting of polystyrene, polyvinyl alcohol, poly methyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the substrate SUB may be variously suitably changed.

The partition wall PW may be provided on the substrate SUB and may define the light emitting region of the light emitting device. Two partition walls PW adjacent to each other may be spaced apart from each other by a distance (e.g., a predetermined distance) on the substrate SUB. For example, two adjacent partition walls PW may be spaced apart on the substrate SUB by the length of the rod-like LED LD or more. The partition wall PW may be an insulating material including an inorganic material or an organic material, but the present invention is not limited thereto. The partition wall PW may have an opening corresponding to the rod-like LED LD.

The first electrode EL1 and the second electrode EL2 may be disposed on the partition wall PW. When viewed in a plan view, the first electrode EL1 and the second electrode EL2 may be disposed on the substrate SUB and spaced apart from each other with the rod-like LED LD interposed therebetween. The first electrode EL1 and the second electrode EL2 may be disposed on the same plane and may have the same height (e.g., the same height above the substrate SUB). When the first electrode EL1 and the second electrode EL2 have the same or substantially the same height (e.g., the same or substantially the same height above the substrate SUB), the rod-like LED LD may be more stably connected to the first and second electrodes EL1 and EL2.

The first and second electrodes EL1 and EL2 may include a conductive material. The conductive material may include a metal, such as silver (Ag), magnesium (Mg), aluminum (Al), platinum (Pt), palladium (Pd), gold (Au), nickel (Ni), neodymium (Nd), iridium (Ir), chromium (Cr), or an alloy thereof, a conductive oxide, such as ITO (indium tin oxide), IZO (indium zinc oxide), ZnO (zinc oxide), or ITZO (indium tin zinc oxide), a conductive polymer, such as PEDOT, or the like. In addition, each of the first and second electrodes EL1 and EL2 may be formed as a single layer, but the present invention is not limited thereto. In some embodiments, each of the first and second electrodes EL1 and EL2 may be formed as a multi-layer structure in which a plurality of metals, alloys, conductive oxides, and/or conductive polymers are stacked. The first and second electrodes EL1 and EL2 are not limited to the above-described materials. For example, the first and second electrodes EL1 and EL2 may be made of a conductive material having a constant or substantially constant reflectance such that light emitted from all sides of (e.g., both ends of) the rod-like LED LD progresses in a direction in which an image is displayed (e.g., a front direction).

For convenience of illustration, FIG. 4 shows the first and second electrodes EL1 and EL2 directly disposed on the substrate SUB including the partition wall PW. However, the present invention is not limited thereto. For example, a component for driving the light emitting device as a passive matrix or an active matrix light emitting device may further be provided between the first and second electrodes EL1 and EL2 and the substrate SUB. When the light emitting device is driven as an active matrix, signal lines, an insulation layer, and/or a transistor may be provided between the first and second electrodes EL1 and EL2 and the substrate SUB.

The signal lines may include a scan line, a data line, a power line, and/or the like. The transistor may be connected to the signal lines and may include a gate electrode, a semiconductor layer, a source electrode, and a drain electrode.

One of the source and drain electrodes of the transistor may be connected to one of the first and second electrodes EL1 and EL2, and a data signal of the data line may be applied to one of the first and second electrodes EL1 and EL2 through the transistor. The signal lines, the insulation layer, and/or the transistor may be provided in various suitable numbers and shapes.

In an embodiment of the present invention, the first electrode EL1 may be connected to a first connection line CNL1. The first connection line CNL1 may be provided integrally with the first electrode EL1 and may extend along a first direction DR1 when viewed in a plan view. When the light emitting device is driven as an active matrix light emitting device, the first connection line CNL1 is electrically connected to one electrode of the transistor to electrically connect the first electrode EL1 and the transistor.

The second electrode EL2 may be connected to a second connection line CNL2. The second connection line CNL2 may be provided integrally with the second electrode EL2 and may extend along the first direction DR1. The second connection line CNL2 may be electrically connected to a driving voltage line DVL through a contact opening (e.g., a contact hole). Therefore, a signal of the driving voltage line DVL may be applied to the second electrode EL2 through the second connection line CNL2. The driving voltage line DVL may extend along a second direction DR2 when viewed in a plan view.

The rod-like LED LD may be disposed between the first and second electrodes EL1 and EL2 on the substrate SUB. Self-alignment of the rod-like LED LD may be induced by an electric field formed between the first and second electrodes EL1 and EL2. The rod-like LED LD may have a rod shape extending in (e.g., aligned in) the first direction DR1.

The rod-like LED LD may include the first conductive semiconductor layer 11, the active layer 12, and the second conductive semiconductor layer 13. The rod-like LED LD may have a first end EP1 and a second end EP2 along the first direction DR1. One of the first and second conductive semiconductor layers 11 and 13 may be disposed at the first end EP1, and the other one of the first and second conductive semiconductor layers 11 and 13 may be disposed at the second end EP2.

A first insulation layer INS1 may be disposed on the rod-like LED LD to cover a portion of the upper surface of the rod-like LED LD. The first and second ends EP1 and EP2 of the rod-like LED LD may be exposed to the outside (e.g., exposed by the first insulation layer INS1).

The first contact electrode CNE1 may be disposed on the first electrode EL1 to electrically and/or physically connect the first electrode EL1 and the first end EP1 of the rod-like LED LD.

The first contact electrode CNE1 may include a transparent conductive material, such as ITO (indium tin oxide), IZO (indium zinc oxide), or ITZO (indium tin zinc oxide), to transmit light emitted from the rod-like LED LD, but the present invention is not limited thereto. The first contact electrode CNE1 may cover the first electrode EL1 and may overlap the first electrode EL1 when viewed in a plan view. In addition, the first contact electrode CNE1 may partially overlap the first end EP1 of the rod-like LED LD.

A second insulation layer INS2 may be disposed on the first contact electrode CNE1 to cover the first contact electrode CNE1. The second insulation layer INS2 prevents the first contact electrode CNE1 from being exposed to the outside, thereby reducing or preventing corrosion of the first contact electrode CNE1. The second insulation layer INS2 may include one of an inorganic insulating material and an organic insulating material.

The second contact electrode CNE2 may be disposed on the second electrode EL2 to electrically and/or physically connect the second electrode EL2 and the second end EP2 of the rod-like LED LD.

The second contact electrode CNE2 may be formed of the same or a substantially similar material as the first contact electrode CNE1, but the present invention is not limited thereto. The second contact electrode CNE2 may cover the second electrode EL2 and may overlap the second electrode EL2 when viewed in a plan view. In addition, the second contact electrode CNE2 may partially overlap the second end EP2 of the rod-like LED LD.

A third insulation layer INS3 may be disposed on the second contact electrode CNE2 to cover the second contact electrode CNE2. The third insulation layer INS3 prevents the second contact electrode CNE2 from being exposed to the outside, thereby reducing or preventing corrosion of the second contact electrode CNE2. The third insulation layer INS3 may include one of an inorganic insulating material and an organic insulating material.

An overcoat layer OC may be disposed on the third insulation layer INS3. The overcoat layer OC may be a planarization layer that flattens surface roughness caused by the underlying components. In addition, the overcoat layer OC may be an encapsulating layer that reduces or prevents oxygen and moisture penetrating into the rod-like LED LD.

As described above, the first end EP1 of the rod-like LED LD may contact the first electrode EL1, and the second end EP2 of the rod-like LED LD may contact the second electrode EL2. For example, the first conductive semiconductor layer 11 of the rod-like LED LD may contact the first electrode EL1, and the second conductive semiconductor layer 13 of the rod-like LED LD may contact the second electrode EL2.

Therefore, the first and second conductive semiconductor layers 11 and 13 of the rod-like LED LD may receive a voltage through the first electrode EL1 and the second electrode EL2.

When an electric field exceeding the threshold voltage is applied to the first and second ends EP1 and EP2 of the rod-like LED LD, the rod-like LED LD emits light due to the electron-hole pairs that are generated in the active layer 12.

Figure 5:
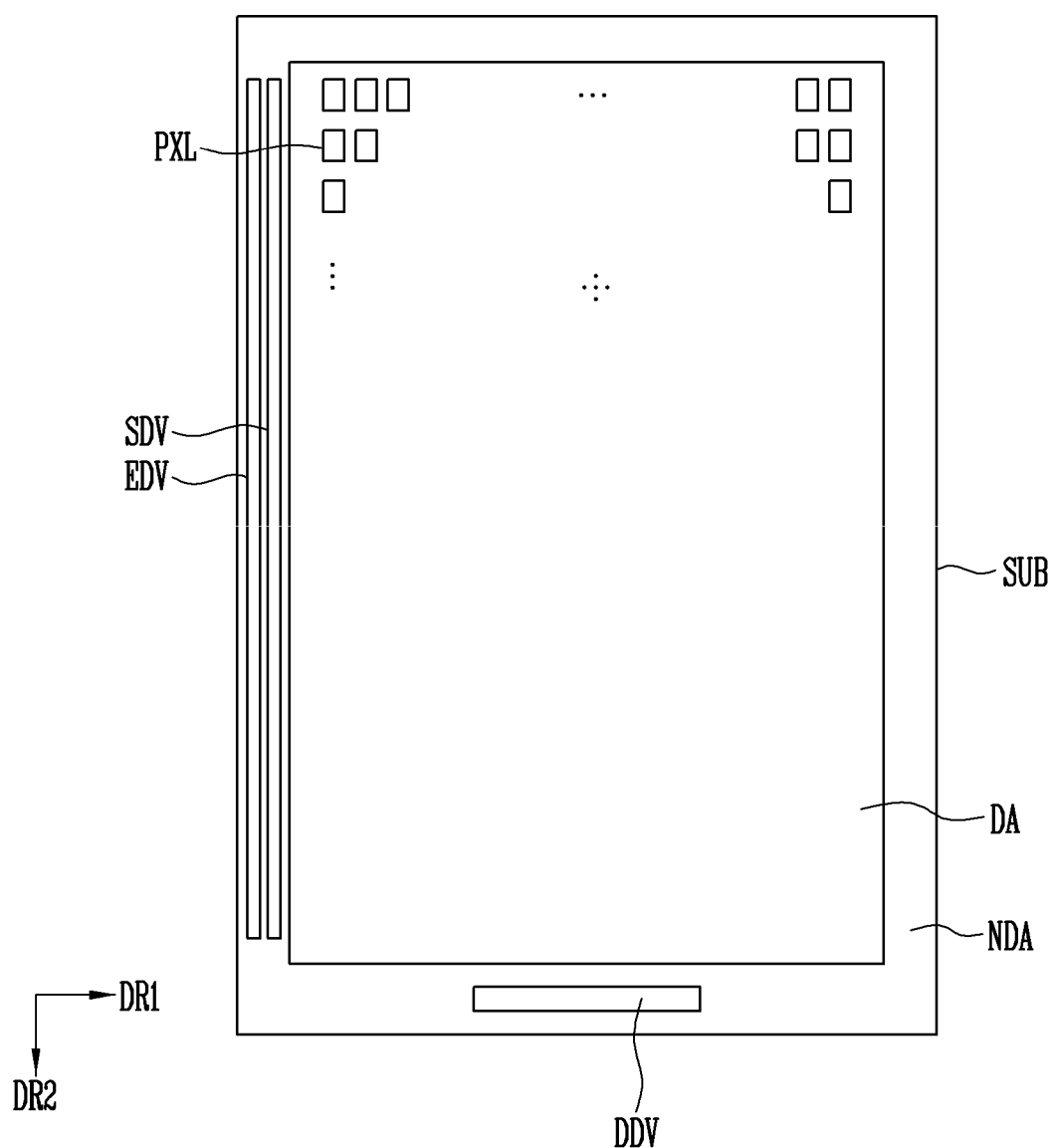
FIG. 5 is a schematic plan view of a display device according to an embodiment of the present invention including the rod-like LED shown in FIG. 1 as a light emitting source.

FIG. 5 is a schematic plan view of the display device according to an embodiment of the present invention including the rod-like LED LD shown in FIG. 1 as a light emitting source.

Referring to FIGS. 1 and 5, the display device according to an embodiment of the present invention may include the substrate SUB, pixels PXL provided on the substrate SUB, a driving unit (e.g., a driver) provided on the substrate SUB to drive the pixels PXL, and a line portion for connecting the pixels PXL and the driving unit.

The substrate SUB may include a display region DA and a non-display region NDA. The display region DA may be a region at where the pixels PXL for displaying an image are provided. The non-display region NDA may be a region at where the driving unit for driving the pixels PXL and a portion of the line portion for connecting the pixels PXL and the driving unit are provided.

The pixels PXL may be provided in the display region DA of the substrate SUB. Each of the pixels PXL may be provided as a minimum unit for displaying an image. Each of the pixels PXL may include a light emitting element that emits white light and/or colors light. Each pixel PXL may emit light having one of red, green, and blue colors, but the present invention is not limited thereto. For example, each pixel PXL may emit light having one of cyan, magenta, yellow, and white colors.

The pixels PXL may be arranged in a matrix form including rows extending in the first direction DR1 and columns extending in the second direction DR2, which crosses the first direction DR1. However, the arrangement form of the pixels PXL is not particularly limited, and the pixels PXL may be arranged in various suitable forms.

The driving unit may supply signals to each pixel PXL through the line portion to control the operation of the pixels PXL.

The driving unit may include a scan driver SDV for providing scan signals to the pixels PXL through scan lines, a light emitting driver EDV for providing light emission control signals to the pixels PXL through light emission control lines, a data driver DDV for providing data signals to the pixels PXL through data lines, and a timing controller.

The timing controller may control the scan driver SDV, the light emitting driver EDV, and the data driver DDV.

Figure 6:
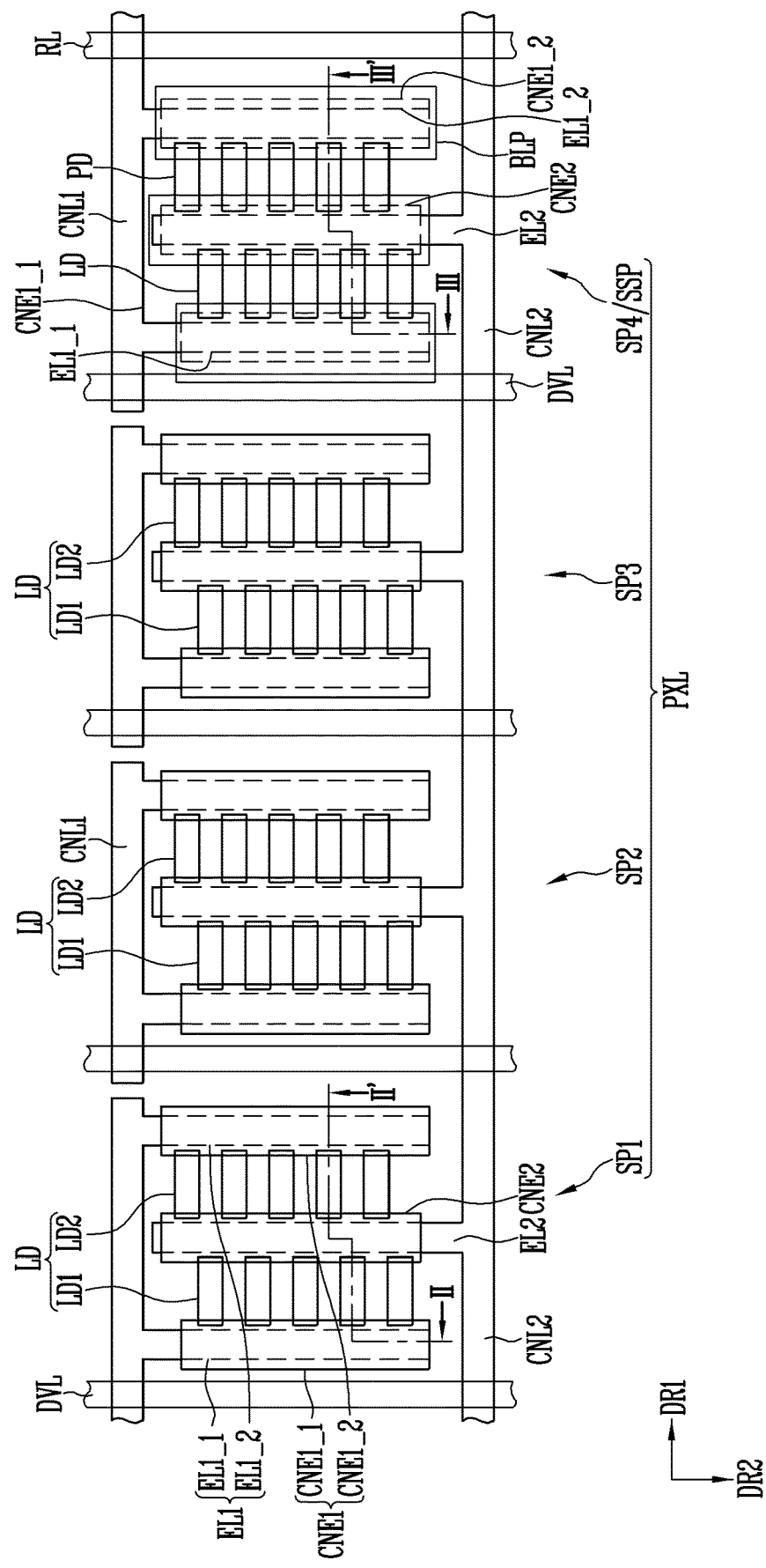
FIG. 6 is a schematic plan view illustrating first to fourth sub-pixels included in one pixel shown in FIG. 5.
Figure 7:
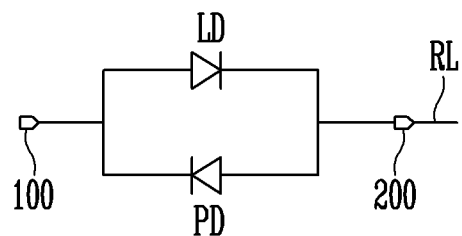
FIG. 7 is a schematic circuit diagram illustrating a photo-coupler included in the fourth sub-pixel shown in FIG. 6.
Figure 8:
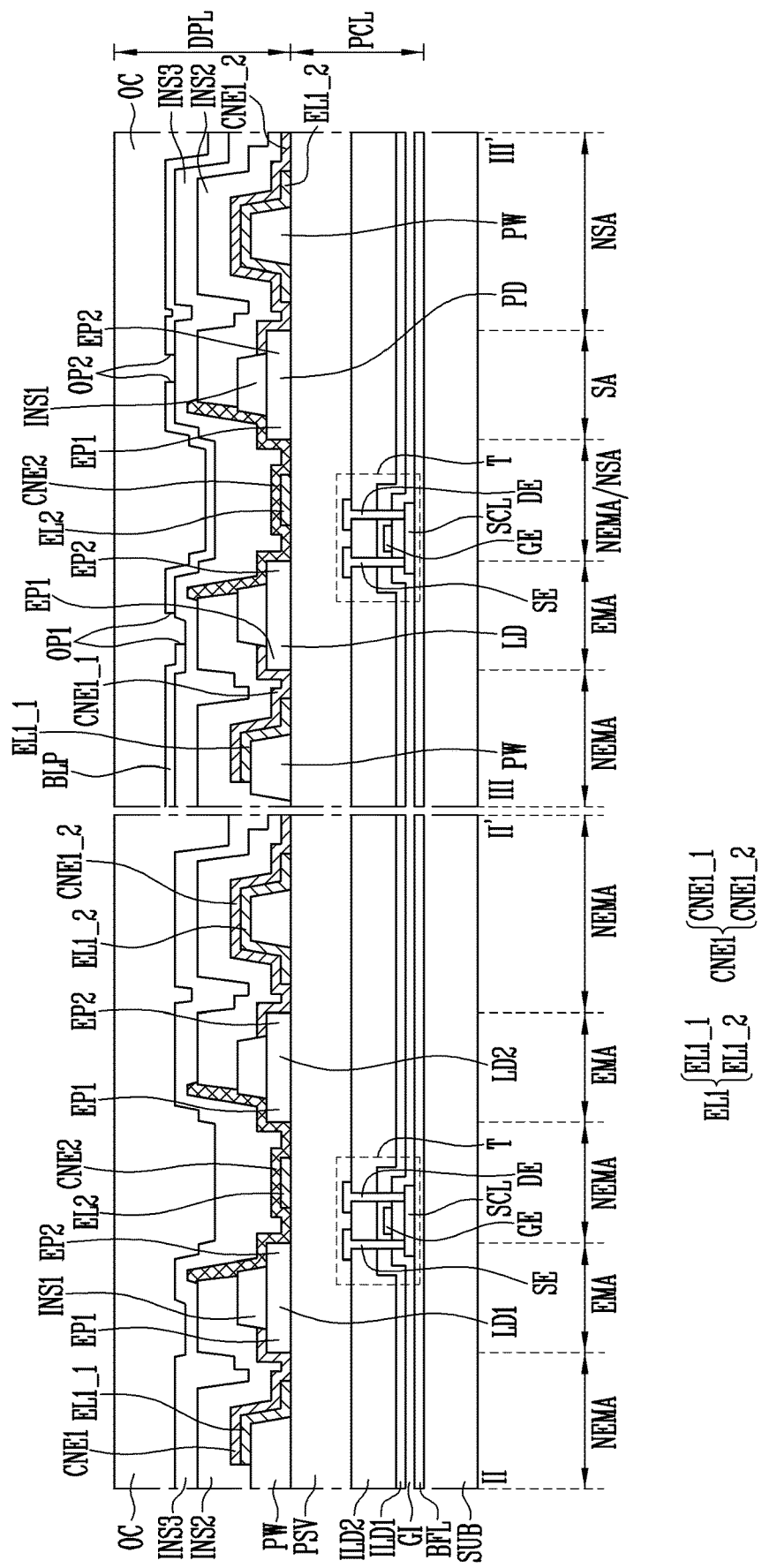
FIG. 8 is a cross-sectional view taken along the lines II-II' and III-III' of FIG. 6.

FIG. 6 is a schematic plan view illustrating first to fourth sub-pixels included in one pixel shown in FIG. 5. FIG. 7 is a schematic circuit diagram illustrating a photo-coupler included in the fourth sub-pixel shown in FIG. 6. FIG. 8 is a cross-sectional view taken along the lines II-II' and III-III' of FIG. 6.

In FIG. 6, the rod-like LEDs LD are shown as being aligned in the horizontal direction, but the arrangement of the rod-like LEDs is not limited thereto. In addition, in FIGS. 6 and 8, the rod-like LEDs LD may be provided in each of the first to fourth sub-pixels.

For convenience of illustration, the transistor connected to the rod-like LEDs LD and the signal lines connected to the transistor are not shown in FIG. 6.

In describing the following embodiment of the present invention, differences from the above-described embodiments are primarily described to avoid redundant description. Parts and/or configurations that are not specifically described in the following embodiment are the same or substantially similar to the parts and/or configurations in the above-described embodiments. The same numerals denote the same constituent elements, and similar numerals denote similar constituent elements. In FIG. 6, the unit light emitting region may be a pixel region including one pixel including the first to fourth sub-pixels.

Referring to FIGS. 1-8, one pixel PXL according to an embodiment of the present invention may include a first sub-pixel SP1, a second sub-pixel SP2, a third sub-pixel SP3, and a fourth sub-pixel SP4 provided on the substrate SUB.

The first, second, and third sub-pixels SP1, SP2, and SP3 may be (or may form) a pixel region of the pixel PXL for displaying an image, and the fourth sub-pixel SP4/SSP may be a sensing region for detecting a user's fingerprint or a user's touch.

For convenience, the first, second, and third sub-pixels SP1, SP2, and SP3 will be described first, and then, the fourth sub-pixel SP4/SSP will be described.

Each of the first, second, and third sub-pixels SP1, SP2, and SP3 may be formed on the substrate SUB and may include a pixel circuit portion PCL and a display element layer DPL.

The substrate SUB may include an insulating material, such as glass, an organic polymer, quartz, or the like. In addition, the substrate SUB may be made of a flexible material to be bendable or foldable and may have a single-layer structure or a multi-layer structure.

The pixel circuit portion PCL may include a buffer layer BFL disposed on the substrate SUB, a transistor T disposed on the buffer layer BFL, and the driving voltage line DVL.

The buffer layer BFL may prevent or reduce impurities from diffusing into the transistor T. The buffer layer BFL may be provided as a single layer but, in other embodiments, may be provided as a plurality of layers. When the buffer layer BFL is provided as multiple layers, each layer may be formed of the same material or the layers may be formed of different materials. The buffer layer BFL may be omitted in some embodiments depending on the material of the substrate SUB and the process conditions.

The transistor T may be electrically connected to a part of the rod-like LEDs LD included in the display element layer DPL to drive the rod-like LEDs LD. The transistor T may include a semiconductor layer SCL, a gate electrode GE, a source electrode SE, and a drain electrode DE.

The semiconductor layer SCL may be disposed on the buffer layer BFL. The semiconductor layer SCL may include a source region contacting the source electrode SE and a drain region contacting the drain electrode DE. The region between the source region and the drain region may be a channel region. The semiconductor layer SCL may be a semiconductor pattern including (or made of) poly silicon, amorphous silicon, oxide semiconductor, or the like. The channel region may be a semiconductor pattern that is not doped with an impurity and may be an intrinsic semiconductor. The source region and the drain region may be semiconductor patterns doped with an impurity.

The gate electrode GE may be disposed on the semiconductor layer SCL with a gate insulation layer GI interposed therebetween.

Each of the source electrode SE and the drain electrode DE of the transistor T may be connected to the source region and the drain region of the semiconductor layer SCL through contact openings (e.g., contact holes) passing through first and second interlayer insulation layers ILD1 and ILD2 and the gate insulation layer GI.

A passivation layer PSV may be disposed on the transistor T.

The driving voltage line DVL may be disposed on the first interlayer insulation layer ILD1 or the second interlayer insulation layer ILD2 and may extend along the second direction DR2 when viewed in a plan view. The driving voltage line DVL may be electrically connected to the display element layer DPL through a contact opening (e.g., contact hole) passing through the passivation layer PSV.

The display element layer DPL may include the rod-like LEDs LD disposed on the passivation layer PSV. Each rod-like LED LD may include the first conductive semiconductor layer 11, the second conductive semiconductor layer 13, and the active layer 12 disposed between the first conductive semiconductor layer 11 and the second conductive semiconductor layer 13. In addition, each rod-like LED LD may have the first end EP1 and the second end EP2 along the first direction DR1. One of the first and second conductive semiconductor layers 11 and 13 may be disposed at the first end EP1, and the other one of the first and second conductive semiconductor layers 11 and 13 may be disposed at the second end EP2.

In an embodiment of the present invention, the rod-like LEDs LD provided in the first sub-pixel SP1 may emit red light, the rod-like LEDs LD provided in the second sub-pixel SP2 may emit green light, and the rod-like LEDs LD provided in the third sub-pixel SP3 may emit blue light, but the present invention is not limited thereto. For example, the rod-like LEDs LD provided in each of the first, second, and third sub-pixels SP1, SP2, and SP3 may emit white light or blue light. Thus, each of the first to third sub-pixels SP1, SP2, and SP3 may include a color conversion layer for emitting light of a color.

In an embodiment of the present invention, the rod-like LEDs LD provided in the first sub-pixel SP1 may emit red light, the rod-like LEDs LD provided in the second sub-pixel SP2 may emit green light, and the rod-like LEDs LD provided in the third sub-pixel SP3 may emit blue light.

In addition, the display element layer DPL may further include the partition wall PW, the first and second electrodes EL1E and EL2, the first and second contact electrodes CNE1 and CNE2, and the first and second connection lines CNL1 and CNL2.

The partition wall PW may be disposed on the passivation layer PSV and may partition light emitting regions EMA in each of the first, second, and third sub-pixels SP1, SP2, and SP3. The partition wall PW may include openings corresponding to the rod-like LEDs LD included in each of the first, second, and third sub-pixels SP1, SP2, and SP3.

The first insulation layer INS1 may be disposed on the substrate SUB and the partition wall PW. The first insulation layer INS1 may cover a portion of the upper surface of each of the rod-like LEDs LD provided in each of the first to third sub-pixels SP1, SP2, and SP3. The first end EP1 and the second end EP2 of each of the rod-like LEDs LD may be exposed to the outside by (or through) the first insulation layer INS1.

The first electrode EL1 may be disposed on the partition wall PW. The first electrode EL1 may be disposed adjacent to the first end EP1 or the second end EP2 of the corresponding rod-like LED LD and may be electrically connected to the corresponding rod-like LED LD through the first contact electrode CNE1. The first electrode EL1 may be electrically connected to the driving voltage line DVL through the contact opening.

When viewed in a plan view, the first electrode EL1 may include a (1-1)th electrode EL1_1 and a (1-2)th electrode EL1_2 which are branched to the left and right sides of the second electrode EL2. Therefore, the (1-1)th and (1-2)th electrodes EL1_1 and EL1_2 and the second electrode EL2 may be alternately arranged on the substrate SUB. The (1-1)th electrode EL1_1 and the (1-2)th electrode EL1_2 may be connected to the first connection line CNL1.

The first connection line CNL1 may apply a voltage to the first electrode EL1 to align the corresponding rod-like LED LD (e.g., to align the rod-like LED LD between the first electrode EL1 and the second electrode EL2).

The second electrode EL2 may be disposed adjacent to one of the first and second ends EP1 and EP2 of the corresponding rod-like LED LD and may be electrically connected to the corresponding rod-like LED LD through the second contact electrode CNE2. The second electrode EL2 included in each of the first, second, and third sub-pixels SP1, SP2, and SP3 may be electrically connected to each other through the second connection line CNL2.

The second electrode EL2 may be electrically connected to the transistor T to receive a signal through the transistor T.

The second connection line CNL2 may apply a voltage to the second electrode EL2 to align the corresponding rod-like LED LD.

In an embodiment of the present invention, the first electrode EL1 and the first connection line CNL1 may be integrally provided, and the second electrode EL2 and the second connection line CNL2 may be integrally provided.

The first electrode EL1, the second electrode EL2, the first connection line CNL1, and the second connection line CNL2 may include the same or a substantially similar material. For example, the first electrode EL1, the second electrode EL2, the first connection line CNL1, and the second connection line CNL2 may include a conductive material.

The conductive material may include a metal, such as Ag, Mg, Al, Pt, Pd, Au, Ni, Nd, Ir, Cr, or an alloy thereof, a conductive oxide, such as ITO (indium tin oxide), IZO (indium zinc oxide), ZnO (zinc oxide) or ITZO (indium tin zinc oxide), a conductive polymer, such as PEDOT, or the like.

In addition, each of the first electrode EL1, the second electrode EL2, the first connection line CNL1, and the second connection line CNL2 may be formed as a single layer, but the present invention is not limited thereto. In other embodiments, each of the first electrode EL1, the second electrode EL2, the first connection line CNL1, and the second connection line CNL2 may be formed as a multi-layer structure in which a plurality of materials, such as metals, alloys, conductive oxides, and conductive polymers, are stacked.

In an embodiment of the present invention, the rod-like LED LD provided in each of the first to third sub-pixels SP1, SP2, and SP3 may include a first rod-like LED LD1 disposed between the (1-1)th electrode EL1_1 and the second electrode EL2 and a second rod-like LED LD2 disposed between the second electrode EL2 and the (1-2)th electrode EL1_2.

The first end EP1 of the first rod-like LED LD1 may be disposed adjacent to the (1-1)th electrode EL1_1, and the second end EP2 of the first rod-like LED LD1 may be disposed adjacent to one side of the second electrode EL2. The first end EP1 of the second rod-like LED LD2 may be disposed adjacent to the other side of the second electrode EL2, and the second end EP2 of the second rod-like LED LD2 may be disposed adjacent to the (1-2)th electrode EL1_2.

The first contact electrode CNE1 for electrically and/or physically connecting the first electrode EL1 and the corresponding rod-like LED LD may be disposed on the first electrode EL1. When viewed in a plan view, the first contact electrode CNE1 may include a (1-1)th contact electrode CNE1_1 overlapping the (1-1)th electrode EL1_1 and a (1-2)th contact electrode CNE1_2 overlapping the (1-2)th electrode EL1_2.

The first end EP1 of the first rod-like LED LD1 may be connected to the (1-1)th electrode EL1_1 through the (1-1)th contact electrode CNE1_1. Therefore, a voltage applied to the driving voltage line DVL may be applied to the first end EP1 of the first rod-like LED LD1 through the (1-1)th electrode EL1_1 and the (1-1)th contact electrode CNE1_1.

The second end EP2 of the second rod-like LED LD2 may be electrically connected to the (1-2)th electrode EL1_2 through the (1-2)th contact electrode CNE1_2. Therefore, the voltage applied to the driving voltage line DVL may be applied to the second end EP2 of the second rod-like LED LD2 through the (1-2)th electrode EL1_2 and the (1-2)th contact electrode CNE1_2.

The second insulation layer INS2 may be disposed on the substrate SUB and the first contact electrode CNE1. The second insulation layer INS2 may be an inorganic insulation layer including an inorganic material or an organic insulation layer including an organic material.

The second contact electrode CNE2 for electrically and/or physically connecting the second electrode EL2 and the corresponding rod-like LED LD may be disposed on the second electrode EL2. The second contact electrode CNE2 may overlap the second electrode EL2 when viewed in a plan view.

The second end EP2 of the first rod-like LED LD1 may be connected to the second electrode EL2 through the second contact electrode CNE2. Therefore, a voltage of the transistor T may be applied to the second end EP2 of the first rod-like LED LD1 through the second electrode EL2 and the second contact electrode CNE2.

Thus, the first and second ends EP1 and EP2 of the first rod-like LED LD1 may receive a voltage (e.g., a predetermined voltage) through the (1-1)th electrode EL1_1 and the second electrode EL2, and the first rod-like LED LD1 may emit light.

The first end EP1 of the second rod-like LED LD2 may be connected to the second electrode EL2 through the second contact electrode CNE2. Therefore, the voltage of the transistor T may be applied to the first end EP1 of the second rod-like LED LD2 through the second electrode EL2 and the second contact electrode CNE2.

Thus, the first and second ends EP1 and EP2 of the second rod-like LED LD2 may receive a voltage (e.g., a predetermined voltage) through the second electrode EL2 and the (1-2)th electrode EL1_2, and the second rod-like LED LD2 may emit light.

The third insulation layer INS3 may be disposed on the substrate SUB and the second contact electrode CNE2. The third insulation layer INS3 may cover the second contact electrode CNE2 (e.g., the second contact electrode CNE2 may be disposed under the third insulation layer INS3) such that the second contact electrode CNE2 is not exposed to the outside.

The overcoat layer OC may be disposed on the third insulation layer INS3.

Next, the fourth sub-pixel SP/SSP will be described. In the following description of the fourth sub-pixel SP/SSP, repeated description of parts and/or configurations that are the same or substantially similar to those of the first, second, and third sub-pixels SP1, SP2, and SP3 may be omitted or shortened in order to avoid duplication of description.

In an embodiment of the present invention, the fourth sub-pixel SP4/SSP may include a light emitting element LD and a light receiving element PD disposed on the substrate SUB. In addition, the fourth sub-pixel SP4/SSP may include a transistor T for driving the light emitting element LD and the light receiving element PD.

The fourth sub-pixel SP4/SSP may have a light emitting region EMA corresponding to the light emitting element LD, a non-light emitting region NEMA excluding (or other than) the light emitting region EMA, a sensing region SA corresponding to the light receiving element PD, and a non-sensing region NSA excluding (or other than) the sensing region SA. The non-sensing region NSA may be the non-light emitting region NEMA, and the non-light emitting region NEMA may be the non-sensing region NSA.

The light emitting element LD may be a rod-like LED LD that emits infrared light. For example, the light emitting element LD may include a gallium arsenide (GaAs) infrared light emitting diode. The light emitting element LD may include the first conductive semiconductor layer 11, the second conductive semiconductor layer 13, and the active layer 12. The light emitting element LD may have the first end EP1 and the second end EP2 along the first direction DR1.

The light emitting element LD may be electrically connected to the transistor T and the driving voltage line DVL.

For example, the first end EP1 of the light emitting element LD may be electrically connected to the (1-1)th electrode EL1_1 of the fourth sub-pixel SP4/SSP through the (1-1)th contact electrode CNE1_1 of the fourth sub-pixel SP4/SSP. The (1-1)th electrode EL1_1 is electrically connected to the driving voltage line DVL so that a voltage applied to the driving voltage line DVL is finally applied to the first end EP1 of the light emitting element LD.

The second end EP2 of the light emitting element LD may be electrically connected to the second electrode EL2 of the fourth sub-pixel SP4/SSP through the second contact electrode CNE2 of the fourth sub-pixel SP4/SSP. The second electrode EL2 is electrically connected to the transistor T of the fourth sub-pixel SP4/SSP so that a voltage of the transistor T is finally applied to the second end EP2 of the light emitting element LD.

The light emitting element LD may emit infrared light having an intensity corresponding to the voltage applied to the first end EP1 and the second end EP2.

When viewed in a plan view, the (1-1)th contact electrode CNE1_1 may overlap the (1-1)th electrode EL1_1 and the first end EP1 of the light emitting element LD, and the second contact electrode CNE2 may overlap the second electrode EL2 and the second end EP2 of the light emitting element LD.

The light receiving element PD may detect the infrared light emitted from the light emitting element LD. The light receiving element PD may include a silicon avalanche photo diode, a pin diode, cadmium sulfide, cadmium selenium, and the like, but the present invention is not limited thereto. In other embodiments, the light receiving element PD may include a photo detector transistor.

The light receiving element PD may have the first end EP1 and the second end EP2 along the first direction DR1.

The first end EP1 of the light receiving element PD may be electrically connected to the other side of the second electrode EL2 through the second contact electrode CNE2. The second electrode CNE2 may be electrically connected to the transistor T of the fourth sub-pixel SP4/SSP. Therefore, the voltage of the transistor T may be finally applied to the first end EP1 of the light receiving element PD.

The second end EP2 of the light receiving element PD may be electrically connected to the (1-2)th electrode EL1_2 of the fourth sub-pixel SP4/SSP through the (1-2)th contact electrode CNE1_2 of the fourth sub-pixel SP4/SSP. The (1-2)th electrode EL1_2 may be electrically connected to the driving voltage line DVL.

Therefore, the voltage applied to the driving voltage line DVL may be finally applied to the second end EP2 of the light receiving element PD.

The light receiving element PD may be driven by the voltage applied to the first end EP1 and the second end EP2 to detect the infrared light emitted from the light emitting element LD and may convert the detected infrared light into an electric signal.

When viewed in a plan view, the second contact electrode CNE2 may overlap the second electrode EL2 and the first end EP1 of the light receiving element PD, and the (1-2)th contact electrode CNE1_2 may overlap the (1-2)th electrode EL1_2 and the second end EP2 of the light receiving element PD.

When a user's hand, an object, or the like is positioned on the display device, the infrared light emitted from the light emitting element LD may be reflected by the user's hand or the object.

The reflected infrared light (hereinafter referred to as "reflected light") may be incident on the light receiving element PD and detected by the light receiving element PD. The reflected light may be converted into an electric signal by the light receiving element PD, and the electric signal may be transmitted to an external sensing circuit through a read-out line RL connected to the light receiving element PD.

The read-out line RL may extend along the second direction DR2 and may electrically connect the light receiving element PD and the external sensing circuit. The external sensing circuit may confirm fingerprint information and/or touch position information of the user through the electric signal obtained from the lead-out line RL.

The infrared light emitted from the light emitting element LD may not affect the image quality of the display device. For example, infrared light has high reflectance and directivity as compared with visible light. Therefore, when a user's hand is positioned on the display device, the infrared light emitted from the light emitting element LD may be reflected relatively more than visible light and may be incident on the light receiving element PD.

The third insulation layer INS3 may be disposed on the light emitting element LD and the light receiving element PD.

In an embodiment of the present invention, the fourth sub-pixel SP4/SSP may further include a light blocking pattern BLP.

The light blocking pattern BLP may be disposed on the third insulation layer INS3. The light blocking pattern BLP may have a first opening OP1 for exposing the third insulation layer INS3 corresponding to the light emitting element LD to the outside and a second opening OP2 for exposing the third insulation layer INS3 corresponding to the light receiving element PD to the outside.

The light blocking pattern BLP may block or mostly block the infrared light emitted from the light emitting element LD from proceeding to the sub-pixels adjacent to the fourth sub-pixel SP4/SSP. For example, the infrared light emitted from the light emitting element LD may be blocked or substantially blocked from proceeding to another region not corresponding to the light emitting element LD by the light blocking pattern BLP.

In addition, the light blocking pattern BLP may be configured such that the infrared light emitted from the light emitting element LD passes through (e.g., passes only through) the first opening OP1.

When the user's hand or the like is positioned on the display device, the infrared light having passed through the first opening OP1 may be reflected by the user's hand and may be incident to (e.g., may pass through) the second opening OP2. The light receiving element PD receives the infrared light incident to the second opening OP2. The light receiving element PD converts the received infrared light into an electric signal and transmits the electric signal to the sensing circuit through the lead-out line RL.

As described above, the light emitting element LD and the light receiving element PD may be provided on the same plane as the passivation layer PSV in the fourth sub-pixel SP4/SSP and may be optically coupled so as to have unidirectionality to form a photo-coupler.

The photo-coupler may have a circuit configuration as shown in FIG. 7. For example, the photo-coupler may have a circuit configuration including an input terminal 100, the light emitting element LD, the light receiving element PD, and an output terminal 200. The input terminal 100 and the output terminal 200 may be electrically insulated from each other.

The light emitting element LD may be disposed between the input terminal 100 and the output terminal 200 and may emit infrared light having an intensity corresponding to an electric field formed between the input terminal 100 and the output terminal 200.

The light receiving element PD is driven by the electric field formed between the input terminal 100 and the output terminal 200. The light receiving element PD detects the infrared light emitted from the light emitting element LD and converts the infrared light into the electric signal. The electric signal may be transmitted to the read-out line RL through the output terminal 200.

The optical coupling between the light emitting element LD and the light receiving element PD of the photo-coupler having the circuit configuration as described above may cause the infrared light emitted from the light emitting element LD to be reflected by the user's hand and be incident on(e.g., directly incident on) the light receiving element PD. Therefore, the intensity of the light incident on the light receiving element PD is relatively increased and the sensitivity of the light receiving element PD may be further improved.

As a result, the touch recognition rate in the fourth sub-pixel SP4/SSP including the light receiving element PD may be improved.

FIGS. 9-16 are cross-sectional views sequentially illustrating a method of manufacturing the fourth sub-pixel shown in FIG. 8.

Figure 9:
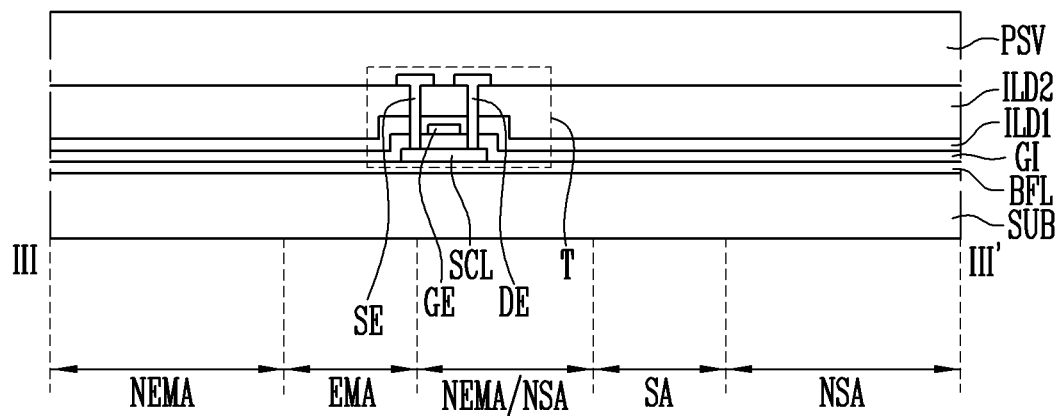
FIGS. 9-16 are cross-sectional views sequentially illustrating a method of manufacturing the fourth sub-pixel shown in FIG. 8.

Referring to FIGS. 8 and 9, the transistor T and the passivation layer PSV covering the transistor T may be formed on the substrate SUB.

The transistor T may include the semiconductor layer SCL disposed on the buffer layer BFL of the substrate SUB, the gate electrode GE disposed on the semiconductor layer SCL with the gate insulation layer GI interposed therebetween, and the source and drain electrodes SE and DE connected to the semiconductor layer SCL.

Figure 10:
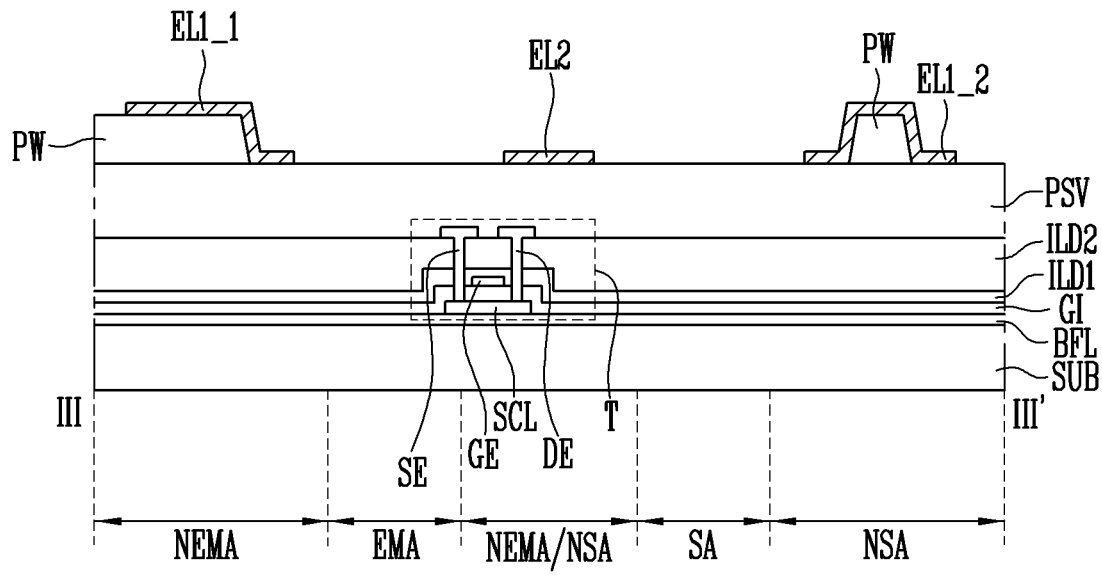

Referring to FIGS. 8 and 10, the partition wall PW may be formed on the passivation layer PSV. The (1-1)th electrode EL1_1, the (1-2)th electrode EL1_2, and the second electrode EL2 may be formed on the substrate SUB including the partition wall PW. The (1-1)th electrode EL1_1 and the (1-2)th electrode EL1_2 may be disposed on the corresponding partition wall PW. The second electrode EL2 may be disposed between the (1-1)th electrode EL1_1 and the (1-2)th electrode EL1_2.

Figure 11:
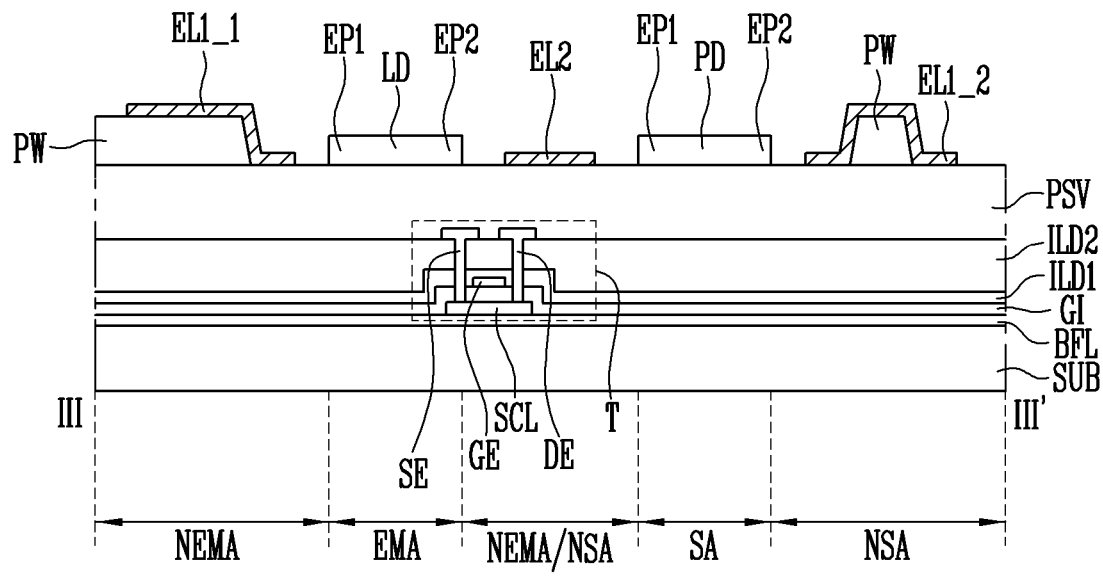

Referring to FIGS. 8 and 11, the light emitting element LD may be dispersed on the substrate SUB when an electric field is applied between the (1-1)th electrode EL1_1 and the second electrode EL2. In addition, the light receiving element PD may be dispersed on the substrate SUB when an electric field is applied between the second electrode EL2 and the (1-2)th electrode EL1_2.

As a non-limiting example of a method of dispersing the light emitting element LD and the light receiving element PD on the substrate SUB on which the (1-1)th electrode EL1_1, the (1-2)th electrode EL1_2, and the second electrode EL2 are formed, an ink-jet printing method may be used. However, the present invention is not limited thereto.

Due to the electric field that is formed between the (1-1)th electrode EL1_1 and the second electrode EL2 when the light emitting element LD is provided, the light emitting element LD may self-align. For example, when a voltage (e.g., a predetermined voltage) is applied to the (1-1)th electrode EL1_1 and the second electrode EL2, an electric field is formed between the (1-1)th electrode EL1_1 and the second electrode EL2 and the light emitting element LD may self-align between the (1-1)th electrode EL1_1 and the second electrode EL2.

Due to the electric field that is formed between the (1-2)th electrode EL1_2 and the second electrode EL2 when the light receiving element PD is provided, the light receiving element PD may self-align. For example, when a voltage (e.g., a predetermined voltage) is applied to the (1-2)th electrode EL1_2 and the second electrode EL2, an electric field is formed between the (1-2)th electrode EL1_2 and the second electrode EL2 and the light receiving element PD may self-align between the (1-2)th electrode EL1_2 and the second electrode EL2.

Figure 12:
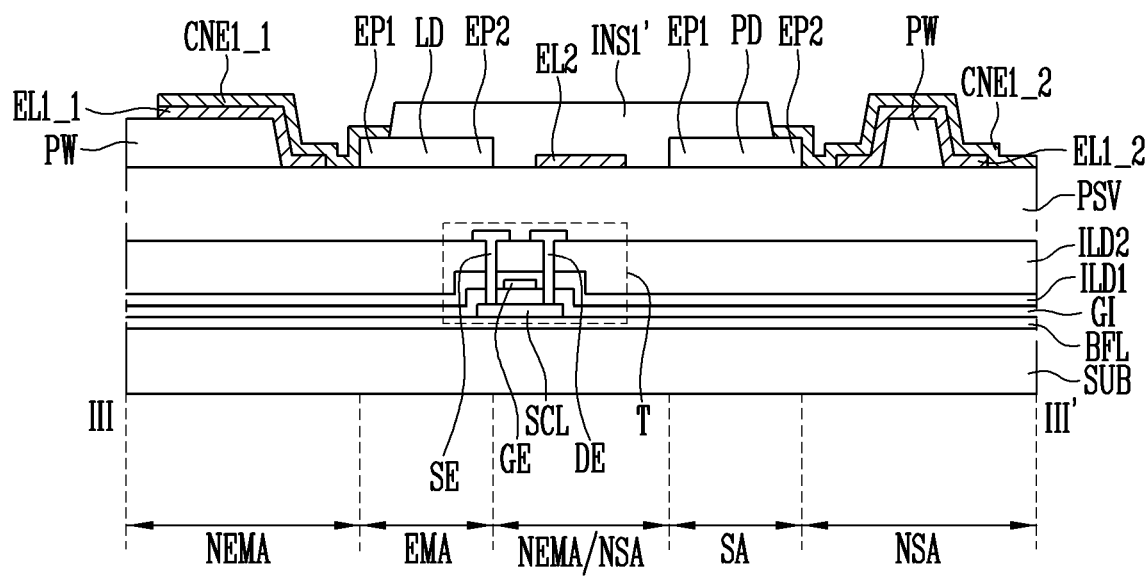

Referring to FIGS. 8 and 12, an insulating material layer may be coated on the entire surface of the substrate SUB on which the light emitting element LD and the light receiving element PD are aligned, and a first insulation pattern INS1' covering the second end EP2 of the light emitting element LD and the first end EP1 of the light receiving element PD may be formed through a mask process. The first end EP1 of the light emitting element LD and the second end EP2 of the light receiving element PD may be exposed to the outside (e.g., may be exposed by the first insulation pattern INS1').

Next, the (1-1)th contact electrode CNE1_1 and the (1-2)th contact electrode CNE1_2 may be formed on the substrate SUB including the first insulation pattern INS1'.

The (1-1)th contact electrode CNE1_1 may cover the (1-1)th electrode EL1_1 and the first end EP1 of the light emitting element LD and may be electrically connected to each of the (1-1)th electrode EL1_1 and the first end EP1 of the light emitting element LD. The (1-1)th contact electrode CNE1_1 may electrically and/or physically connect the (1-1)th electrode EL1_1 with the first end EP1 of the light emitting element LD.

The (1-2)th contact electrode CNE1_2 may cover the (1-2)th electrode EL1_2 and the second end EP2 of the light receiving element PD and may be electrically connected to each of the (1-2)th electrode EL1_2 and the second end EP2 of the light receiving element PD. The (1-2)th contact electrode CNE1_2 may electrically and/or physically connect the (1-2)th electrode EL1_2 with the second end EP2 of the light receiving element PD.

Figure 13:
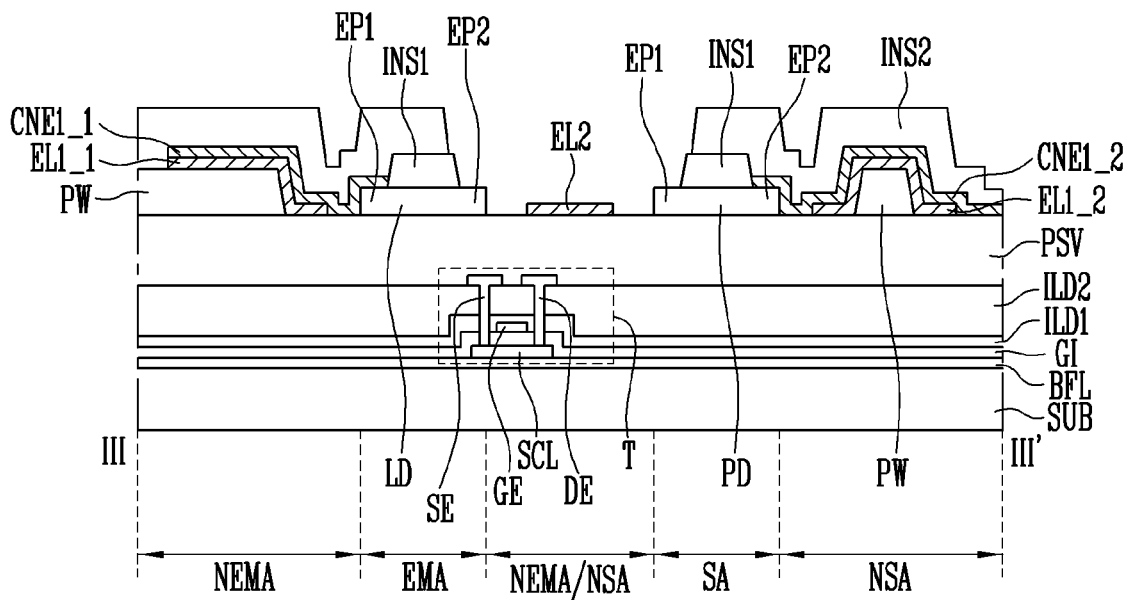

Referring to FIGS. 8 and 13, an insulating material layer may be coated on the entire surface of the substrate SUB including the (1-1)th contact electrode CNE1_1 and the (1-2)th contact electrode CNE1_2, and the second insulation layer INS2 exposing the second electrode EL2, the second end EP2 of the light emitting element LD, and the first end EP1 of the light receiving element PD may be formed through a mask process. The insulating material layer and the first insulation pattern INS1' may be patterned by the mask process to form the second insulating layer INS2 and the first insulating layer INS1 exposing the second end EP2 of the light emitting element LD, the second electrode EL2, and the first end EP1 of the light receiving element PD.

Figure 14:
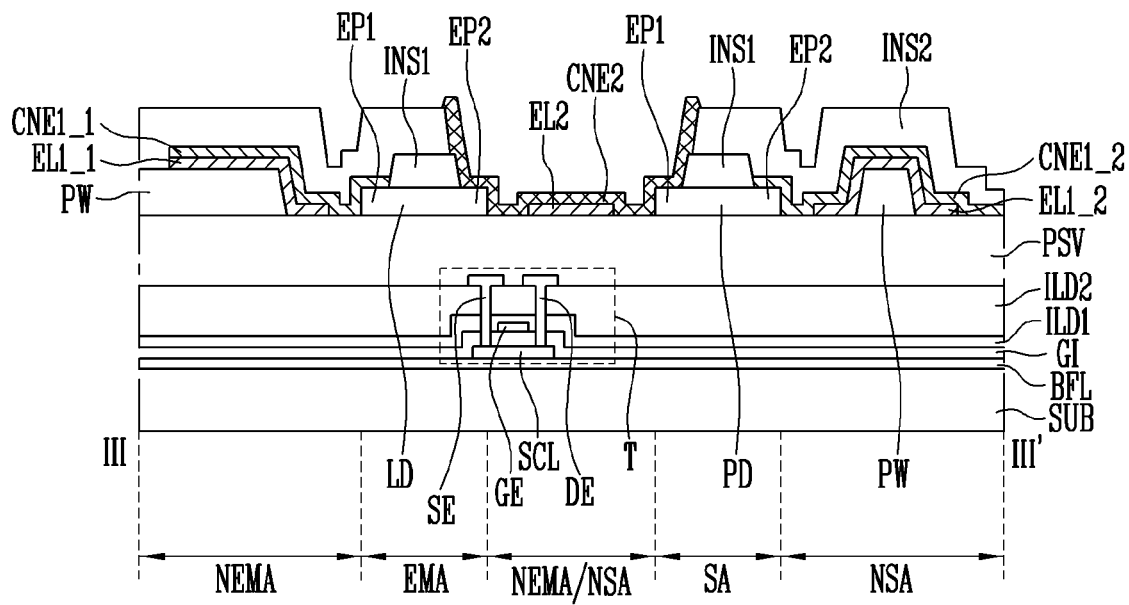

Referring to FIGS. 8 and 14, the second contact electrode CNE2 may be formed on the substrate SUB including the second insulation layer INS2. The second contact electrode CNE2 may cover the second electrode EL2, the second end EP2 of the light emitting element LD, and the first end EP1 of the light receiving element PD.

The second contact electrode CNE2 may be connected to each of the second end EP2 of the light emitting element LD and the second electrode EL2 and may electrically and/or physically connect the second end EP2 of the light emitting element LD with the second electrode EL2. In addition, the second contact electrode CNE2 may be connected to each of the first end EP1 of the light receiving element PD and the second electrode EL2 and may electrically and/or physically connect the first end EP1 of the light receiving element PD with the second electrode EL2.

The second end EP2 of the light emitting element LD and the first end EP1 of the light receiving element PD may be electrically connected to each other by the second contact electrode CNE2. In an embodiment of the present invention, the light emitting element LD and the light receiving element PD may be optically coupled in a direction extending from the second end EP2 of the light emitting element LD toward the first end EP1 of the light receiving element PD. That is, the light emitting element LD and the light receiving element PD may form the photo-coupler in the fourth sub-pixel SP4/SSP.

Figure 15:
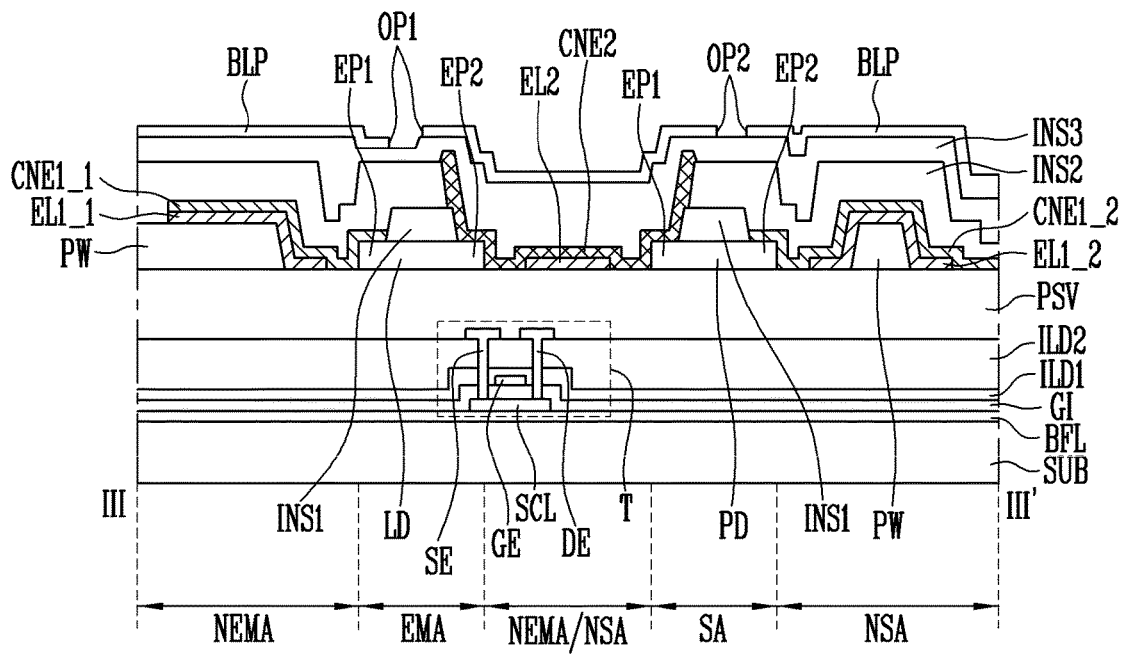

Referring to FIGS. 8 and 15, the third insulation layer INS3 may be formed on the entire surface of the substrate SUB including the second contact electrode CNE2. The third insulation layer INS3 may cover the second contact electrode CNE2 such that the second contact electrode CNE2 may not corrode.

Next, the light blocking pattern BLP may be formed on the third insulation layer INS3. The light blocking pattern BLP may have a first opening OP1 for exposing a portion of the third insulation layer INS3 corresponding to the light emitting element LD and a second opening OP2 for exposing a portion of the third insulation layer INS3 corresponding to the light receiving element PD.

Figure 16:
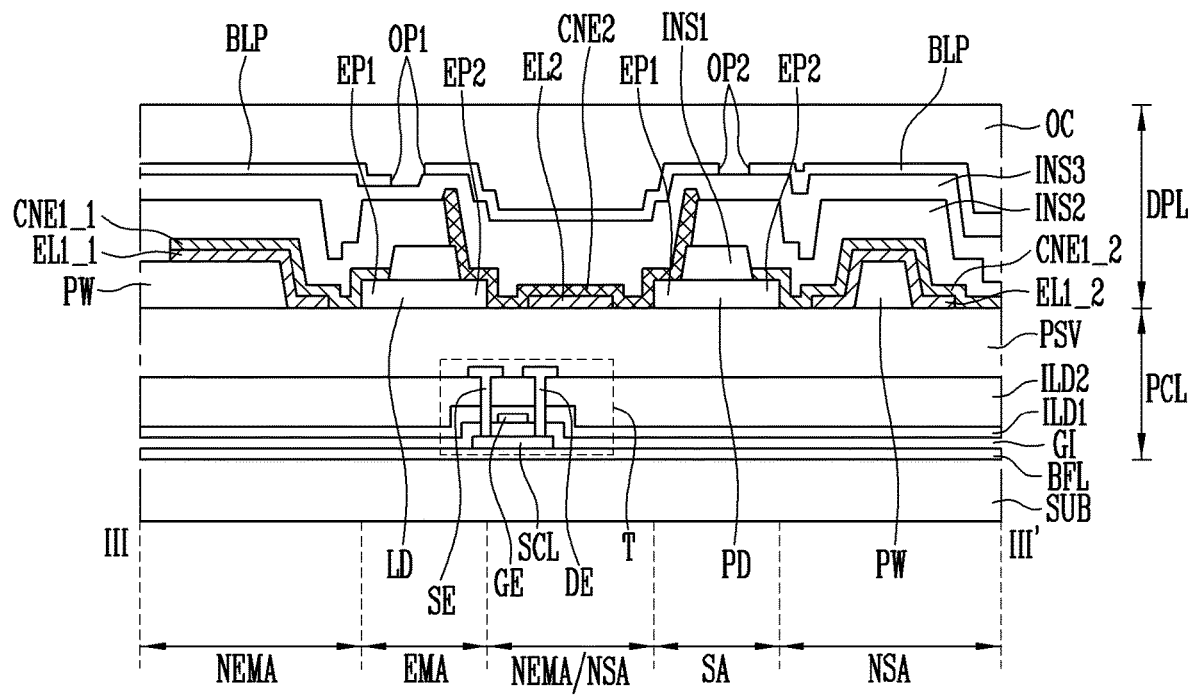

Referring to FIGS. 8 and 16, the overcoat layer OC may be formed on the entire surface of the substrate SUB including the light blocking pattern BLP.

The overcoat layer OC may cover the light blocking pattern BLP such that the light blocking pattern BLP may not corrode. In addition, the overcoat layer OC may flatten the surface roughened due to the underlying components disposed below the overcoat layer OC. In addition, the overcoat layer OC may prevent or reduce oxygen and moisture penetrating into the light emitting element LD and the light receiving element PD from the outside.

Figure 17:
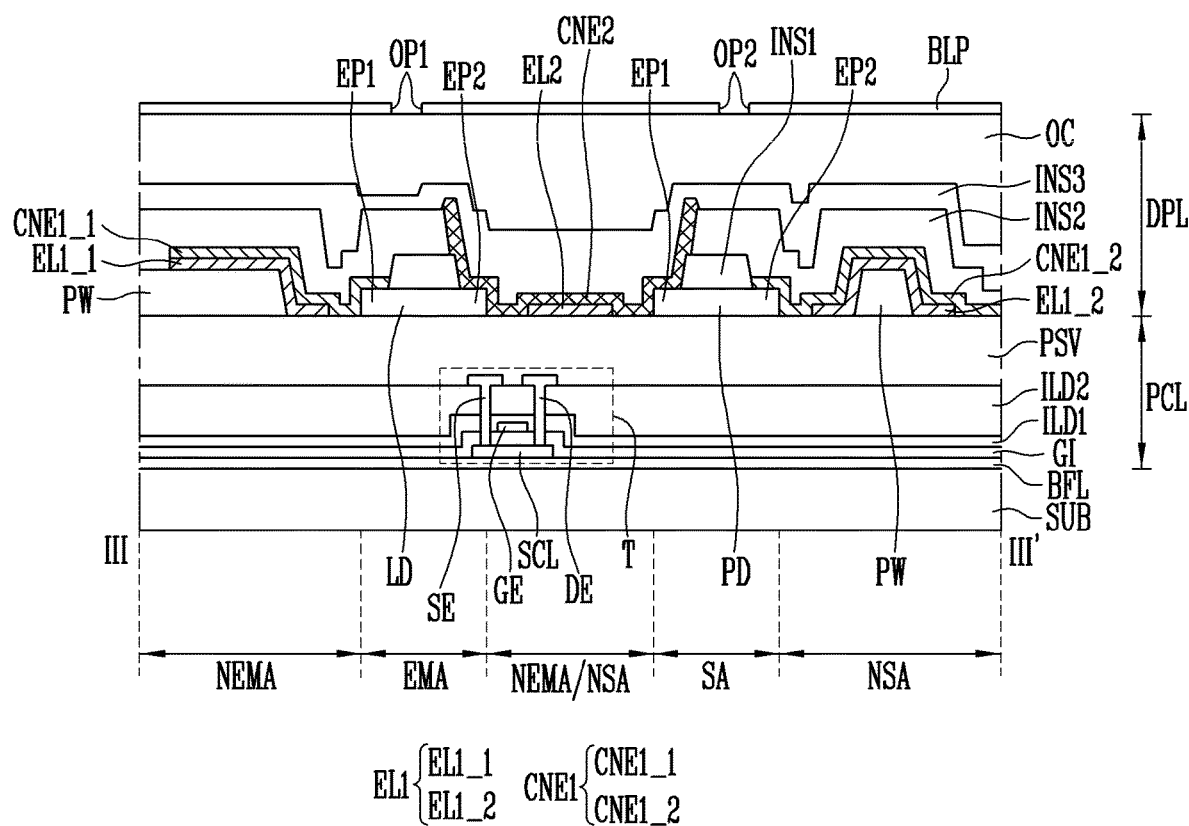
FIG. 17 is a cross-sectional view taken along the line III-III' of FIG. 6 and illustrates a display device according to another embodiment of the present invention.

FIG. 17 is a cross-sectional view taken along the line III-III' of FIG. 6 and illustrates a display device according to another embodiment of the present invention. In the below-described embodiment of the present invention, different parts and/or configurations from the above-described embodiments will be primarily described in order to avoid redundant description. The parts and/or configurations that are not specifically described in the following embodiment correspond to the same or substantially similar parts and/or configurations in the above-described embodiments. For example, the same numerals denote the same constituent elements, and similar numerals denote similar constituent elements.

A configuration of the display device shown in FIG. 17 may be substantially the same as or similar to the display device including the fourth sub-pixel shown in FIGS. 6 and 8 except that the light blocking pattern included in the display element layer is disposed on the overcoat layer.

Referring to FIGS. 6, 8, and 17, the display device according to another embodiment of the present invention may include the substrate SUB, the pixel circuit portion PCL provided on the substrate SUB, and the display element layer DPL provided on the pixel circuit portion PCL.

The display element layer DPL may include the light emitting element LD and the light receiving element PD forming the photo-coupler. In an embodiment of the present invention, the light emitting element LD may be a rod-like LED that emits infrared light. The light receiving element PD may be a photo diode that receives the infrared light emitted from the light emitting element LD that is reflected by a user's hand or an object.

In addition, the display element layer DPL may further include the overcoat layer OC provided on the light emitting element LD and the light receiving element PD to cover the light emitting element LD and the light receiving element PD.

The light blocking pattern BLP may be provided on the overcoat layer OC. The light blocking pattern BLP may have the first opening OP1 exposing a portion of the overcoat layer OC corresponding to the light emitting element LD and the second opening OP2 exposing a portion of the overcoat layer OC corresponding to the light receiving element PD.

The light blocking pattern BLP may prevent or substantially prevent the infrared light emitted from the light emitting element LD from proceeding to the other sub-pixels SP1, SP2, and SP3 other than the fourth sub-pixel SP4/SSP. In addition, the light blocking pattern BLP may allow the infrared light emitted from the light emitting element LD to pass through (e.g., to pass through only) the first opening OP1. When the user's hand or the like is positioned on the display device, the infrared light having passed through the first opening OP1 may be reflected by the user's hand and may be incident to the second opening OP2. The light receiving element PD receives the infrared light incident to the second opening OP2. The light receiving element PD converts the received infrared light into an electric signal and transmits the electric signal to the sensing circuit through the lead-out line RL.

When the light blocking pattern BLP is provided on the overcoat layer OC, a passivation layer may be provided on the light blocking pattern BLP to protect the light blocking pattern BLP.

Figure 18:
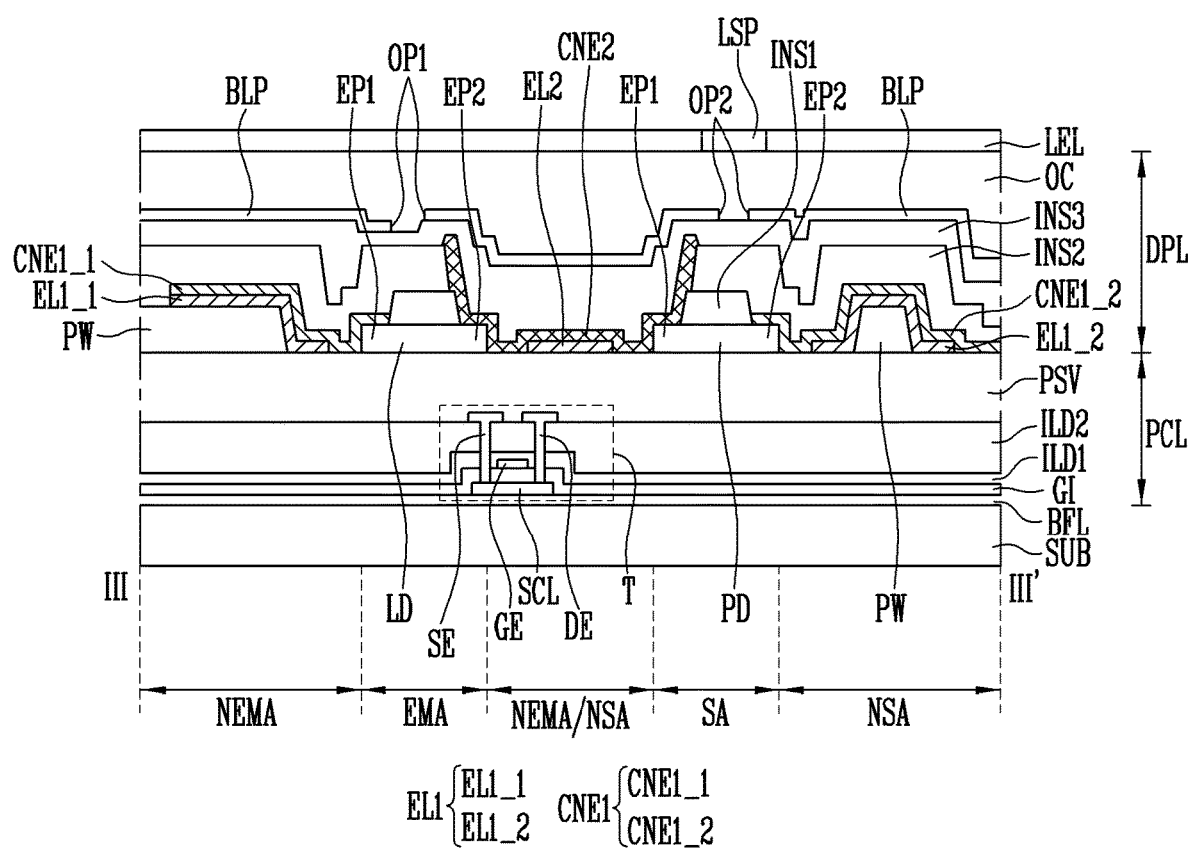
FIG. 18 is a cross-sectional view taken along the line III-III' of FIG. 6 and illustrates a display device according to another embodiment of the present invention.

FIG. 18 is a cross-sectional view taken along the line III-III' of FIG. 6 and illustrates a display device according to another embodiment of the present invention. In the below-described embodiment of the present invention, different parts and/or configurations from the above-described embodiments will be primarily described in order to avoid redundant description. The parts and/or configurations that are not specifically described in the following embodiment correspond to the same or substantially similar parts and/or configurations in the above-described embodiments. For example, the same numerals denote the same constituent elements, and similar numerals denote similar constituent elements.

A configuration of the display device shown in FIG. 18 may be substantially the same as or similar to the display device including the fourth sub-pixel shown in FIGS. 6 and 8 except that a light extracting layer is further disposed on the overcoat layer included in the display element layer.

Referring to FIGS. 6, 8, and 18, the display device according to another embodiment of the present invention may include the substrate SUB, the pixel circuit portion PCL provided on the substrate SUB, and the display element layer DPL provided on the pixel circuit portion PCL.

The display element layer DPL may include the light emitting element LD and the light receiving element PD forming the photo-coupler. In an embodiment of the present invention, the light emitting element LD may be the rod-like LED that emits infrared light. The light receiving element PD may be a photo diode that receives the infrared light emitted from the light emitting element LD that is reflected by a user's hand or an object.

In addition, the display element layer DPL may include the light blocking pattern BLP having the first opening OP1 exposing a portion of the third insulation layer INS3 corresponding to the light emitting element LD and the second opening OP2 exposing a portion of the third insulation layer INS3 corresponding to the light receiving element PD. The overcoat layer OC may be provided on the light blocking pattern BLP.

In an embodiment of the present invention, the display element layer DPL may further include the light extracting layer LEL provided on the overcoat layer OC. The light extracting layer LEL may include a lens portion LSP corresponding to the second opening OP2. When the infrared light having passed through the first opening OP1 is reflected by the user's hand and is incident to the second opening OP2, the lens portion LSP may condense (or focus) the infrared light incident to the second opening OP2. The intensity of light incident on the light receiving element DP may be relatively increased by the lens portion LSP and sensitivity of the light receiving element DP may be improved.

The lens portion LSP may have a spherical shape, a hemispherical shape, a hyper-hemispherical shape, a concave shape, a convex shape, a polygonal shape, and the like. However, the shape of the lens portion LSP may be variously suitably changed according to refractive indexes of the overcoat layer OC and the third insulation layer INS3 disposed between (e.g., disposed in the space between) the light receiving element PD and the lens portion LSP. In addition, the curvature of the lens portion LSP may suitably vary according to the distance from the light receiving element PD and the like.

Figure 19:
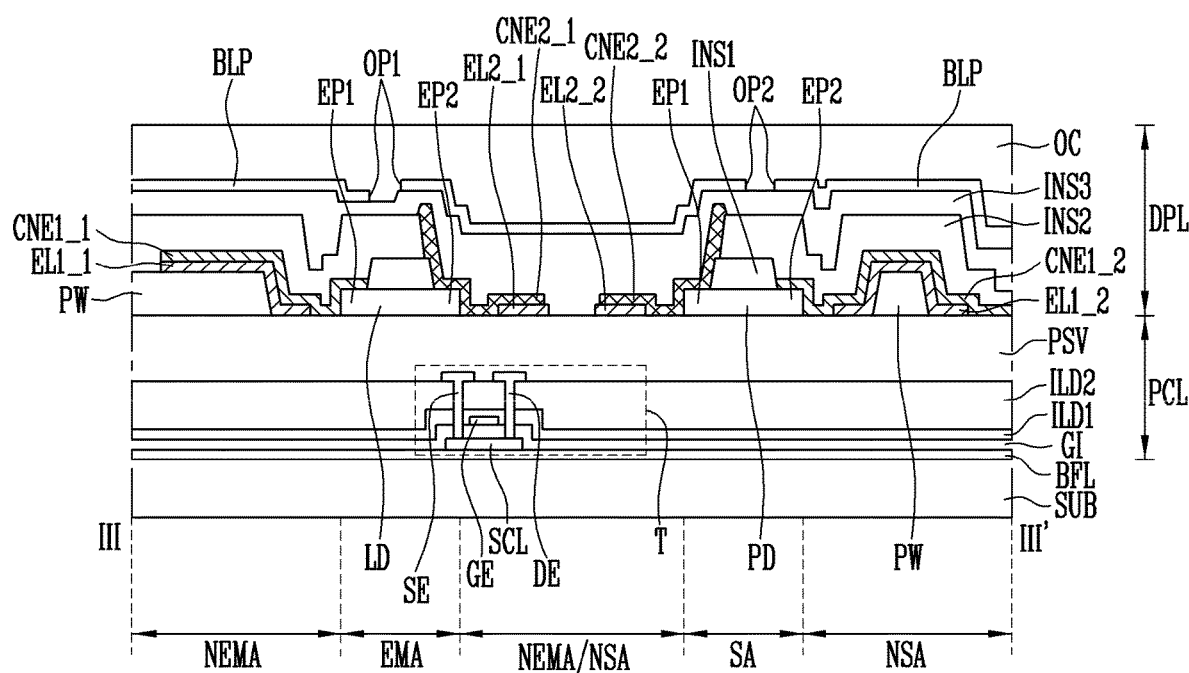
FIG. 19 is a cross-sectional view taken along the line III-III' of FIG. 6 and illustrates a display device according to another embodiment of the present invention.

FIG. 19 is a cross-sectional view taken along the line III-III' of FIG. 6 and illustrates a display device according to another embodiment of the present invention. In the below-described embodiment of the present invention, different parts and/or configurations from the above-described embodiments will be primarily described in order to avoid redundant description. The parts and/or configurations that are not specifically described in the following embodiment correspond to the same or substantially similar parts and/or configurations in the above-described embodiments. For example, the same numerals denote the same constituent elements, and similar numerals denote similar constituent elements.

A configuration of the display device shown in FIG. 19 may be substantially the same as or similar to the display device including the fourth sub-pixel shown in FIGS. 6 and 8 except that the second end of the light emitting element and the first end of the light receiving element are connected to different second contact electrodes in the display element layer.

Referring to FIGS. 6, 8, and 19, the display device according to another embodiment of the present invention may include the substrate SUB, the pixel circuit portion PCL provided on the substrate SUB, and the display element layer DPL provided on the pixel circuit portion PCL.

The display element layer DPL may include the light emitting element LD and the light receiving element PD forming the photo-coupler. In an embodiment of the present invention, the light emitting element LD may be the rod-like LED that emits infrared light. The light receiving element PD may be a photo diode that receives the infrared light emitted from the light emitting element LD that is reflected by a user's hand or an object.

The display element layer DPL may include the (1-1)th electrode EL1_1 and the (2-1)th electrode EL2_1 spaced apart from each other with the light emitting element LD interposed therebetween on the passivation layer PSV. The (1-1)th electrode EL1_1 may be disposed adjacent to the first end EP1 of the light emitting element LD and the (2-1)th electrode EL2_1 may be disposed adjacent to the second end EP2 of the light emitting element LD.

The (1-1)th contact electrode CNE1_1 may be disposed on the (1-1)th electrode EL1_1 and the first end EP1 of the light emitting element LD, and the (2-1)th contact electrode CNE2_1 may be disposed on the (2-1)th electrode EL2_1 and the second end EP2 of the light emitting element LD. The (1-1)th contact electrode CNE1_1 may electrically and/or physically connect the first end EP1 of the light emitting element LD and the (1-1)th electrode EL1_1. The (2-1)th contact electrode CNE2_1 may electrically and/or physically connect the second end EP2 of the light emitting element LD and the (2-1)th electrode EL2_1.

In addition, the display element layer DPL may include the (2-)th electrode EL2_2 and the (1-2)th electrode EL1_2 spaced apart from each other with the light emitting element LD interposed therebetween on the passivation layer PSV. The (2-2)th electrode EL2_2 may be disposed adjacent to the first end EP1 of the light receiving element PD, and the (1-2)th electrode EL1_2 may be disposed adjacent to the second end EP2 of the light receiving element PD.

The (1-2)th contact electrode CNE1_2 may be disposed on the (1-2)th electrode EL1_2 and the second end EP2 of the light receiving element PD, and the (2-2)th contact electrode CNE2_2 may be disposed on the (2-2)th electrode EL2_2 and the first end EP1 of the light receiving element PD. The (1-2)th contact electrode CNE1_2 may electrically and/or physically connect the second end EP2 of the light receiving element PD and the (1-2)th electrode EL1_2. The (2-2)th contact electrode CNE2_2 may electrically and/or physically connect the first end EP1 of the light receiving element PD and the (2-2)th electrode EL2_2.

As described above, the first end EP1 of the light emitting element LD may be electrically connected to the (1-1)th electrode EL1_1, and the second end EP2 of the light emitting element LD may be electrically connected to the (2-1)th electrode EL2_1. The first end EP1 of the light receiving element PD may be electrically connected to the (2-2)th electrode EL2_2, and the second end EP2 of the light receiving element PD may be electrically connected to the (1-2)th electrode EL1_2.

In an embodiment of the present invention, the (2-1)th electrode EL2_1 and the (2-2)th electrode EL2_2 may be provided on the same plane as the passivation layer PSV, may be spaced apart from each other by a distance (e.g., by a predetermined distance), and may be electrically insulated from each other by the third insulation layer INS3.

The intensity of the infrared light emitted from the light emitting element LD may be controlled by the voltage applied to the (1-1)th electrode EL1_1 and the (2-1)th electrode EL2_1. In addition, the sensitivity for reading infrared light incident on the light receiving element PD may be controlled by the voltage applied to the (1-2)th electrode EL1_2 and the (2-2)th electrode EL2_2.

As a result, the light emitting element LD and the light receiving element PD may be driven separately in the fourth sub-pixel SP4/SSP.

According to an embodiment of the present invention, the photo-coupler is provided in the sub-pixel and the touch recognition rate of the display device may be improved.

The display device according to embodiments of the present invention may be employed in various electronic devices. For example, the display device may be applied to a television, a notebook, a mobile phone, a smart phone, a smart pad (PD), a PMP, a PDA, a navigation device, various wearable devices, such as a smart watch, or the like.

As described above, example embodiments of the present invention have been disclosed in the detailed description and the drawings. It is to be understood that the terminology used herein is for the purpose of describing the present invention and should not be used to limit the scope of the present invention as set forth in the claims and their equivalents. Those skilled in the art will appreciate that various modifications and equivalent embodiments are possible without departing from the scope of the present invention. Accordingly, the scope of the present invention should be determined by the technical features set forth in the appended claims and their equivalents.

What is claimed is:

1. A display device comprising:
a substrate; and
a plurality of pixels disposed in the substrate, each of the pixels comprising first and second sub-pixels, each of the first and second sub-pixels having a light emitting region for emitting light,
wherein the first sub-pixel comprises:
a first contact electrode, a second contact electrode, and a third contact electrode disposed on the substrate and spaced apart from each other;
a first light emitting element disposed between the first contact electrode and the second contact electrode and electrically connected to the first contact electrode and the second contact electrode;
a second light emitting element disposed between the second contact electrode and the third contact electrode and electrically connected to the second contact electrode and the third contact electrode;
a first electrode overlapping the first contact electrode on the substrate and adjacent to a first end of the first light emitting element;
a second electrode overlapping the second contact electrode on the substrate and adjacent to a second end of the first light emitting element and a first end of the second light emitting element; and
a third electrode overlapping the third contact electrode on the substrate and adjacent to a second end of the second light emitting element,
wherein the second end of the first light emitting element and the first end of the second light emitting element are electrically connected to the second contact electrode.

2. The display device of claim 1, wherein:
the first contact electrode directly contacts the first electrode,
the second contact electrode directly contacts the second electrode, and
the third contact electrode directly contacts the third electrode.

3. The display device of claim 2, wherein:
a first end of each of a first connection line, a second connection line, and a third connection line is electrically connected to a driving voltage line,
a second end of the first connection line is electrically connected to the first electrode,
a second end of the second connection line is electrically connected to the second electrode, and
a second end of the third connection line is electrically connected to the third electrode.

4. The display device of claim 3, wherein:
the first connection line is provided integrally with the first electrode,
the second connection line is provided integrally with the second electrode, and
the third connection line is provided integrally with the third electrode.

5. The display device of claim 2, further comprising, in a plan view, a first partition wall and a second partition wall facing each other with the first light emitting element and the second light emitting element therebetween.

6. The display device of claim 5, wherein:
the first electrode is disposed on the first partition wall, and
the third electrode is disposed on the second partition wall.

7. The display device of claim 6, wherein:
the second electrode directly contacts the substrate, and
the first light emitting element, the second light emitting element, and the second electrode are on a same layer.

8. The display device of claim 1, wherein the second sub-pixel comprises:
a fourth contact electrode, a fifth contact electrode, and a sixth contact electrode disposed on the substrate and spaced apart from each other;
a third light emitting element disposed between the fourth contact electrode and the fifth contact electrode and electrically connected to the fourth contact electrode and the fifth contact electrode; and
a light receiving element disposed between the fifth contact electrode and the sixth contact electrode and electrically connected to the fifth contact electrode and the sixth contact electrode.

9. The display device of claim 8, wherein:
the third light emitting element has a first end electrically connected to the fourth contact electrode and a second end electrically connected to the fifth contact electrode; and
the light receiving element has a first end electrically connected to the fifth contact electrode and a second end electrically connected to the sixth contact electrode.

10. The display device of claim 9, wherein the second sub-pixel further comprises:
a fourth electrode overlapping the fourth contact electrode on the substrate and adjacent to the first end of the third light emitting element;
a fifth electrode overlapping the sixth contact electrode on the substrate and adjacent to the second end of the third light emitting element and the first end of the light receiving element; and
a sixth electrode overlapping the sixth contact electrode on the substrate and adjacent to the second end of the light receiving element, and
wherein the second end of the third light emitting element and the first end of the light receiving element are electrically connected to the fifth contact electrode.

11. The display device of claim 9, wherein:
the first and second light emitting elements are configured to emit visible light,
the third light emitting element is configured to emit infrared light, the light receiving element is configured to receive the infrared light emitted from the third light emitting element to detect a user's touch, and
the third light emitting element and the light receiving element are electrically insulated from and optically coupled to each other to form a photo-coupler.

12. The display device of claim 11, wherein the second sub-pixel further comprises:
a third insulation layer on the substrate, the third light emitting element, and the light receiving element; and
an overcoat layer on the third insulation layer.

13. The display device of claim 12, further comprising a light blocking pattern on the third insulation layer in the second sub-pixel,
wherein the light blocking pattern has a first opening exposing a portion of the third insulation layer corresponding to the third light emitting element and a second opening exposing a portion of the third insulation layer corresponding to the light receiving element, and
wherein the light blocking pattern is not in the first sub-pixel.

14. The display device of claim 9, further comprising:
a third insulation pattern covering a portion of the third light emitting element; and
a fourth insulation pattern covering a portion of the light receiving element,
wherein the first and second ends of the third light emitting element are exposed to the outside by the third insulation pattern, and
wherein the first and second ends of the light receiving element are exposed to the outside by the fourth insulation pattern.

15. The display device of claim 1, further comprising:
a first insulation pattern covering a portion of the first light emitting element; and
a second insulation pattern covering a portion of the second light emitting element,
wherein the first and second ends of the first light emitting element are exposed to the outside by the first insulation pattern, and
wherein the first and second ends of the second light emitting element are exposed to the outside by the second insulation pattern.

* * * * *